United States Patent
Chen et al.

(10) Patent No.: US 7,486,212 B2
(45) Date of Patent: *Feb. 3, 2009

(54) VARIABLE LENGTH CODING FOR SPARSE COEFFICIENTS

(75) Inventors: Wen-hsiung Chen, Sunnyvale, CA (US); John A. Toebes, Cary, NC (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/761,307

(22) Filed: Jun. 11, 2007

(65) Prior Publication Data

US 2007/0279266 A1     Dec. 6, 2007

Related U.S. Application Data

(63) Continuation of application No. 11/346,757, filed on Feb. 3, 2006, now Pat. No. 7,242,328.

(51) Int. Cl.
     *H03M 7/40*      (2006.01)
(52) U.S. Cl. .............................. 341/67; 341/65; 341/50
(58) Field of Classification Search .................. 341/67, 341/65, 50, 51; 704/230; 382/232, 245
See application file for complete search history.

(56) References Cited

U.S. PATENT DOCUMENTS

| | | | |
|---|---|---|---|
| 4,698,672 A | 10/1987 | Chen et al. .................. | 358/136 |
| 4,706,265 A | 11/1987 | Furukawa ..................... | 375/122 |
| 4,813,056 A | 3/1989 | Fedele ............................ | 375/27 |
| 4,845,560 A | 7/1989 | Kondo et al. .................. | 358/133 |
| 4,858,017 A | 8/1989 | Torbey ........................ | 358/426 |
| 4,920,426 A | 4/1990 | Hatori et al. ................. | 358/433 |
| 4,922,510 A | 5/1990 | Brusewitz ..................... | 375/122 |
| 4,937,573 A | 6/1990 | Silvio et al. .................... | 341/67 |

(Continued)

FOREIGN PATENT DOCUMENTS

| | | |
|---|---|---|
| EP | 0 266 049 A2 | 5/1988 |
| WO | WO 93/18616 | 9/1993 |
| WO | WO 03/090421 | 10/2003 |

OTHER PUBLICATIONS

G. Cote, B. Erol, M. Gallant, & F. Kossentini, "H.263+: Video Coding at Low Bit Rates" in *IEEE Transactions on Circuits and Systems for Video Technology*, vol. 8, No. 7, Nov. 1998.

(Continued)

*Primary Examiner*—Peguy JeanPierre
(74) *Attorney, Agent, or Firm*—Dov Rosenfeld; Inventek

(57) ABSTRACT

Coding quantized transform coefficients as occur in image compression includes, for a subset of coefficient amplitude values coding by a first method corresponding to each amplitude of the subset, events of a run of zero or more zero-valued coefficients ending in the single non-zero amplitude, coding by a second method events of a run of zero or more zero-valued coefficients ending in any single non-zero amplitude not in the subset, and coding by a third method the amplitude values of the concatenation of the non-zero amplitude not in the subset. The coding methods produce variable length codewords. The method is suitable for series that have scattered non-zero-valued coefficients.

20 Claims, 10 Drawing Sheets

U.S. PATENT DOCUMENTS

| | | | |
|---|---|---|---|
| 4,985,700 A | 1/1991 | Mikami | 341/59 |
| 4,985,766 A | 1/1991 | Morrison et al. | 358/133 |
| 5,006,930 A | 4/1991 | Stroppiana et al. | 358/133 |
| 5,045,938 A | 9/1991 | Sugiyama | 358/133 |
| 5,062,152 A | 10/1991 | Faulkner | 359/185 |
| 5,086,488 A | 2/1992 | Kato et al. | 382/56 |
| 5,128,758 A | 7/1992 | Azadegan et al. | 358/133 |
| 5,136,376 A | 8/1992 | Yagasaki et al. | 358/133 |
| 5,162,795 A | 11/1992 | Shirota | 341/67 |
| 5,166,684 A | 11/1992 | Juri et al. | 341/67 |
| 5,179,442 A | 1/1993 | Azadegan et al. | 358/133 |
| 5,226,082 A | 7/1993 | Kustka | 380/46 |
| 5,253,053 A | 10/1993 | Chu et al. | 358/133 |
| 5,253,055 A | 10/1993 | Civanlar et al. | 358/133 |
| 5,291,282 A | 3/1994 | Nakagawa et al. | 348/384 |
| 5,298,991 A | 3/1994 | Yagasaki et al. | 348/416 |
| 5,301,032 A | 4/1994 | Hong et al. | 358/261.2 |
| 5,307,163 A | 4/1994 | Hatano et al. | 348/415 |
| 5,319,457 A | 6/1994 | Nakahashi et al. | 348/387 |
| 5,337,087 A | 8/1994 | Mishima | 348/405 |
| 5,363,097 A | 11/1994 | Jan | 341/67 |
| 5,371,811 A | 12/1994 | Morrison et al. | 382/56 |
| 5,400,075 A | 3/1995 | Savatier | 348/384 |
| 5,402,244 A | 3/1995 | Kim | 358/261.2 |
| 5,446,744 A | 8/1995 | Nagasawa et al. | 371/37.4 |
| RE35,093 E | 11/1995 | Wang et al. | 348/413 |
| 5,475,501 A | 12/1995 | Yagasaki | 358/426 |
| 5,479,527 A | 12/1995 | Chen | 382/232 |
| 5,488,367 A | 1/1996 | Kitamura | 341/106 |
| 5,488,418 A | 1/1996 | Mishima et al. | 348/398 |
| 5,488,616 A | 1/1996 | Takishima et al. | 371/30 |
| 5,491,480 A | 2/1996 | Jan et al. | 341/67 |
| 5,528,628 A | 6/1996 | Park et al. | 375/240 |
| 5,539,401 A | 7/1996 | Kumaki et al. | 341/67 |
| 5,642,115 A | 6/1997 | Chen | 341/67 |
| 5,644,305 A | 7/1997 | Inoue et al. | 341/67 |
| 5,648,774 A | 7/1997 | Hsieh | 341/67 |
| 5,650,782 A | 7/1997 | Kim | 341/67 |
| 5,694,127 A * | 12/1997 | Tayama | 341/67 |
| 5,696,558 A | 12/1997 | Tsukamoto | 348/405 |
| 5,717,394 A | 2/1998 | Schwartz et al. | 341/51 |
| 5,731,836 A | 3/1998 | Lee | 348/402 |
| 5,740,283 A | 4/1998 | Meeker | 382/248 |
| 5,751,232 A | 5/1998 | Inoue et al. | 341/63 |
| 5,767,800 A | 6/1998 | Machida et al. | 341/67 |
| 5,767,908 A | 6/1998 | Choi | 348/403 |
| 5,774,594 A | 6/1998 | Kitamura | 382/239 |
| 5,793,432 A | 8/1998 | Mishima et al. | 348/423 |
| 5,793,897 A | 8/1998 | Jo et al. | 382/246 |
| 5,818,877 A | 10/1998 | Tsai et al. | 375/241 |
| 5,822,463 A | 10/1998 | Yokose et al. | 382/251 |
| 5,832,130 A | 11/1998 | Kim | 382/248 |
| 5,844,611 A | 12/1998 | Hamano et al. | 348/403 |
| 5,852,469 A | 12/1998 | Nagai et al. | 348/384 |
| 5,883,589 A | 3/1999 | Takishima et al. | 341/67 |
| 5,923,813 A | 7/1999 | Okamoto et al. | 386/109 |
| 5,956,153 A | 9/1999 | Hirabayashi | 358/433 |
| 5,982,437 A | 11/1999 | Okazaki et al. | 348/413 |
| 5,999,111 A | 12/1999 | Park et al. | 341/67 |
| 6,014,095 A | 1/2000 | Yokoyama | 341/67 |
| 6,104,754 A | 8/2000 | Chujoh et al. | 375/240 |
| 6,111,914 A | 8/2000 | Bist | 375/240 |
| 6,118,822 A | 9/2000 | Bist | 375/240 |
| 6,140,944 A | 10/2000 | Toyoyama | 341/63 |
| 6,144,322 A | 11/2000 | Sato | 341/67 |
| 6,192,138 B1 * | 2/2001 | Yamadaji | 382/100 |
| 6,198,848 B1 | 3/2001 | Honma et al. | 382/232 |
| 6,218,968 B1 | 4/2001 | Smeets et al. | 341/65 |
| 6,229,460 B1 | 5/2001 | Tsai et al. | 341/67 |
| 6,256,064 B1 | 7/2001 | Chujoh et al. | 348/240.23 |
| 6,278,801 B1 | 8/2001 | Boon | 382/246 |
| 6,304,607 B1 | 10/2001 | Talluri et al. | 375/240.27 |
| 6,339,386 B1 | 1/2002 | Cho | 341/67 |
| 6,388,588 B2 | 5/2002 | Kitamura | 341/67 |
| 6,404,929 B1 | 6/2002 | Boon | 382/233 |
| 6,408,029 B1 | 6/2002 | McVeigh et al. | 375/240.13 |
| 6,445,314 B1 | 9/2002 | Zhang et al. | 341/67 |
| 6,445,739 B1 | 9/2002 | Shen et al. | 375/240.03 |
| 6,477,280 B1 | 11/2002 | Malvar | 382/245 |
| 6,771,828 B1 | 8/2004 | Malvar | 382/240 |
| 2004/0228540 A1 | 11/2004 | Chen et al. | 382/246 |

OTHER PUBLICATIONS

T. Chujoh & Y. Kikuchi, "An improved variable length coding", *Joint Video Team (JVT) of ISO/IEC Mpeg & ITU-T VCEG*, 2nd Meeting: Geneva, CH, Jan. 29-Feb. 1, 2002.

M.Luttrell, J. Wen, H. Yao, and J. Villasen: "Robust Low Bit Rate Wireless Video Communications," Final Report, Project 97-193, University of California MICRO project, available on http://www.ucop.edu/research/micro/97_98/97_193.pdf.

P.N. Tudor, "MPEG-2 Video Compression", IEE J Langham Thompson Prize, *Electronics& Communication Engineering Journal*, Dec. 1995. Available on http://www.bbc.co.uk/rd/pubs/papers/paper_14/paper_14.html.

"H.264/MPEG-4 AVC Video Compression Tutorial", *VideoLocus*, 2000, available on http://www.videolocus.com.

"MPEG-1 Video Codec", pp. 1-8, available on http://www.cmlab.csie.ntu.edu.tw/cml/dsp/training/coding/mpeg1/.

K. Takagi, "Reversiblity of Code", *Joint Video Team (JVT) of ISO/IEC MPEG & ITU-T VCEG*, 2nd Meeting: Geneva, CH, Jan. 29-Feb. 1, 2002.

A. Bist, "An Adaptive Quantization Scheme for H.263++", ITU-Telecommunication Standardization Sector q15a49, Working party 15/1, Expert's Group on Very Low Bitrate Visual Telephony, Portland, Jun. 24-27, 1997.

Reed, E.C. and Lim, J.S. "Efficient Coding of DCT Coefficients by Joint Position-Dependent Encoding." *Proceedings of the 19998 IEEE International Conference on Acoustics, Speech and Signal Processing*, May 12, 1998, pp. 2817-2820, IEEE, New York, NY.

Cheung, K.M. and Kiely, A. "An Efficient Variable Length Coding Scheme for an IID Source." *Proceedings of the Data Compression Conference*, Mar. 28, 1995, pp. 182-191, IEEE Computer Society Press, Los Alamitos, CA.

Simon, S. and De Vriendt, J. "Progressive Image Transmission with Run-Length Coding." *Journal on Communications*, vol. 45, May 1994, pp. 45-50, Budapest, Hungary.

Jeon, B., Park, J. and Jeong, J. "Huffman Coding of DCT Coefficients Using Dynamic Codeword Assignment and Adaptive Codebook Selection." *Signal Processing Image Communication*, vol. 12, No. 3, Jun. 1, 1998, pp. 253-262, Elsevier Science Publishers, Amsterdam, NL.

Chandra, A. and Chakrabarty, K. "Reduction of SOC Test Data Volume, Scan Power and Testing Time Using Alternating Run-length Codes." *Proceedings of the 39th Design Automation Conference*, Jun. 10, 2002, pp. 673-678, ACM, New York, NY.

Taubman, D.S. "Section 2.4.3: Run-Length Coding." *JPEG2000: Image Compression Fundamentals, Standards, and Practice*, 2002, Kluwer Academic Publishers, Dordrecht, NL.

Golomb, S. "Run-Length Encodings." *IEEE Transactions on Information Theory*, vol. 12, No. 3, Jul. 1966, pp. 399-401.

Gallager, R.G. and Van Voorhis, D.C. "Optimal Source Codes for Geometrically Distributed Integer Alphabets." *IEEE Transactions on Information Theory*, vol. IT-21, No. 2, Mar. 1975, pp. 228-230.

* cited by examiner

Table 3: 2D-VLC codes for amplitude 1 and non-amplitude 1

|  | Runlength of preceding 0's | | | | | | | | |
|---|---|---|---|---|---|---|---|---|---|
|  | 0 | 1 | 2 | 3 | 4 | 5 | 6 | . | . |
| Amplitude 1 | $^1c_0$ | $^1c_1$ | $^1c_2$ | $^1c_3$ | $^1c_4$ | $^1c_5$ | $^1c_6$ | . | . |
| Amplitude >1 | $^1c'_0$ | $^1c'_1$ | $^1c'_2$ | $^1c'_3$ | $^1c'_4$ | $^1c'_5$ | $^1c'_6$ | . | . |

FIG. 2A

Table 4: 2D-VLC codes for amplitudes ≥ 2

|  |  | Runlength of preceding amplitude-2 coeffs. | | | | | | | | |
|---|---|---|---|---|---|---|---|---|---|---|
|  |  | 0 | 1 | 2 | 3 | 4 | 5 | 6 | . | . |
| Coeff. Amp. | 3 | $^1a_{30}$ | $^1a_{31}$ | $^1a_{32}$ | $^1a_{33}$ | $^1a_{34}$ | $^1a_{35}$ | $^1a_{36}$ | . | . |
|  | 4 | $^1a_{40}$ | $^1a_{41}$ | $^1a_{42}$ | $^1a_{43}$ | $^1a_{44}$ | $^1a_{45}$ | $^1a_{46}$ | . | . |
|  | 5 | $^1a_{50}$ | $^1a_{51}$ | $^1a_{52}$ | $^1a_{53}$ | $^1a_{54}$ | $^1a_{55}$ | $^1a_{56}$ | . | . |
|  | 6 | $^1a_{60}$ | $^1a_{61}$ | $^1a_{62}$ | $^1a_{63}$ | $^1a_{64}$ | $^1a_{65}$ | $^1a_{66}$ | . | . |
|  | 7 | $^1a_{70}$ | $^1a_{71}$ | $^1a_{72}$ | $^1a_{73}$ | $^1a_{74}$ | $^1a_{75}$ | $^1a_{76}$ | . | . |
|  | 8 | $^1a_{80}$ | $^1a_{81}$ | $^1a_{82}$ | $^1a_{83}$ | $^1a_{84}$ | $^1a_{85}$ | $^1a_{86}$ | . | . |
|  | 9 | $^1a_{90}$ | $^1a_{91}$ | $^1a_{92}$ | $^1a_{93}$ | $^1a_{94}$ | $^1a_{95}$ | $^1a_{96}$ | . | . |
|  | . | . | . | . | . | . | . | . | . | . |
|  | . | . | . | . | . | . | . | . | . | . |

FIG. 2B

Table 5: 2D-VLC codes for amplitude 1, amplit. 2 and amplit>2.

|  | Runlength of preceding 0's | | | | | | | | |
|---|---|---|---|---|---|---|---|---|---|
|  | 0 | 1 | 2 | 3 | 4 | 5 | 6 | . | . |
| Amplitude 1 | $^1c_0$ | $^1c_1$ | $^1c_2$ | $^1c_3$ | $^1c_4$ | $^1c_5$ | $^1c_6$ | . | . |
| Amplitude 2 | $^2c_0$ | $^2c_1$ | $^2c_2$ | $^2c_3$ | $^2c_4$ | $^2c_5$ | $^2c_6$ | : | : |
| Amplitude >2 | $^2c'_0$ | $^2c'_1$ | $^2c'_2$ | $^2c'_3$ | $^2c'_4$ | $^2c'_5$ | $^2c'_6$ | . | . |

FIG. 4A

Table 6: 2D-VLC codes for amplitudes ≥ 3

| | | Runlength of preceding amplitude-3 coeffs. | | | | | | | |
|---|---|---|---|---|---|---|---|---|---|
| | | 0 | 1 | 2 | 3 | 4 | 5 | 6 | . | . |
| Coeff. Amp. | 4 | $^2A_{40}$ | $^2A_{41}$ | $^2A_{42}$ | $^2A_{43}$ | $^2A_{44}$ | $^2A_{45}$ | $^2A_{46}$ | . | . |
| | 5 | $^2A_{50}$ | $^2A_{51}$ | $^2A_{52}$ | $^2A_{53}$ | $^2A_{54}$ | $^2A_{55}$ | $^2A_{56}$ | . | . |
| | 6 | $^2A_{60}$ | $^2A_{61}$ | $^2A_{62}$ | $^2A_{63}$ | $^2A_{64}$ | $^2A_{65}$ | $^2A_{66}$ | . | . |
| | 7 | $^2A_{70}$ | $^2A_{71}$ | $^2A_{72}$ | $^2A_{73}$ | $^2A_{74}$ | $^2A_{75}$ | $^2A_{76}$ | . | . |
| | 8 | $^2A_{80}$ | $^2A_{81}$ | $^2A_{82}$ | $^2A_{83}$ | $^2A_{84}$ | $^2A_{85}$ | $^2A_{86}$ | . | . |
| | 9 | $^2A_{90}$ | $^2A_{91}$ | $^2A_{92}$ | $^2A_{93}$ | $^2A_{94}$ | $^2A_{95}$ | $^2A_{96}$ | . | . |
| | . | . | . | . | . | . | . | . | . | . |
| | . | . | . | . | . | . | . | . | . | . |

FIG. 4B

Table 7: 2D-VLC codes for amplitude 1 and amplitude > 1

|  | Runlength of preceding 0's |  |  |  |  |  |  |  |  |
|---|---|---|---|---|---|---|---|---|---|
|  | 0 | 1 | 2 | 3 | 4 | 5 | 6 | . | . |
| Amplitude 1 | $^1c_0$ | $^1c_1$ | $^1c_2$ | $^1c_3$ | $^1c_4$ | $^1c_5$ | $^1c_6$ | . | . |
| Amplitude >1 | $^1c'_0$ | $^1c'_1$ | $^1c'_2$ | $^1c'_3$ | $^1c'_4$ | $^1c'_5$ | $^1c'_6$ | . | . |

FIG. 6A

Table 8: 2D-VLC codes for amplitude 3 and amplitude > 3

|  | Runlength of preceding 2's |  |  |  |  |  |  |  |  |
|---|---|---|---|---|---|---|---|---|---|
|  | 0 | 1 | 2 | 3 | 4 | 5 | 6 | . | . |
| Amplitude 3 | $^3c_0$ | $^3c_1$ | $^3c_2$ | $^3c_3$ | $^3c_4$ | $^3c_5$ | $^3c_6$ | . | . |
| Amplitude >3 | $^3c'_0$ | $^3c'_1$ | $^3c'_2$ | $^3c'_3$ | $^3c'_4$ | $^3c'_5$ | $^3c'_6$ | . | . |

FIG. 6B

Table 9: 2D-VLC codes for amplitude 5 and amplitude > 5

|  | Runlength of preceding 4's ||||||||
|---|---|---|---|---|---|---|---|---|
|  | 0 | 1 | 2 | 3 | 4 | 5 | 6 | . | . |
| Amplitude 5 | $^5c_0$ | $^5c_1$ | $^5c_2$ | $^5c_3$ | $^5c_4$ | $^5c_5$ | $^5c_6$ | . | . |
| Amplitude >5 | $^5c'_0$ | $^5c'_1$ | $^5c'_2$ | $^5c'_3$ | $^5c'_4$ | $^5c'_5$ | $^5c'_6$ | . | . |

FIG. 6C

Table 10: 2D-VLC codes for amplitude K and amplitude > K

|  | Runlength of preceding K's (K=0,2,4,...) ||||||||
|---|---|---|---|---|---|---|---|---|
|  | 0 | 1 | 2 | 3 | 4 | 5 | 6 | . | . |
| Amplitude K | $^Kc_0$ | $^Kc_1$ | $^Kc_2$ | $^Kc_3$ | $^Kc_4$ | $^Kc_5$ | $^Kc_6$ | . | . |
| Amplitude >K | $^Kc'_0$ | $^Kc'_1$ | $^Kc'_2$ | $^Kc'_3$ | $^Kc'_4$ | $^Kc'_5$ | $^Kc'_6$ | . | . |

FIG. 6D

Table 1: 2D-VLC statistics

|  |  | \multicolumn{9}{c}{Runlength of preceding 0's} |
|---|---|---|---|---|---|---|---|---|---|---|
|  |  | 0 | 1 | 2 | 3 | 4 | 5 | 6 | . | . |
|  | 1 | S10 | S11 | S12 | S13 | S14 | S15 | S16 | . | . |
|  | 2 | S20 | S21 | S22 | S23 | S24 | S25 | S26 | . | . |
|  | 3 | S30 | S31 | S32 | S33 | S34 | S35 | S36 | . | . |
|  | 4 | S40 | S41 | S42 | S43 | S44 | S45 | S46 | . | . |
| Coeff. Amp. | 5 | S50 | S51 | S52 | S53 | S54 | S55 | S56 | . | . |
|  | 6 | S60 | S61 | S62 | S63 | S64 | S65 | S66 | . | . |
|  | 7 | S70 | S71 | S72 | S73 | S74 | S75 | S76 | . | . |
|  | 8 | S80 | S81 | S82 | S83 | S84 | S85 | S86 | . | . |
|  | 9 | S90 | S91 | S92 | S93 | S94 | S95 | S96 | . | . |
|  | . | . | . | . | . | . | . | . | . | . |
|  | . | . | . | . | . | . | . | . | . | . |
|  | . | . | . | . | . | . | . | . | . | . |

FIG. 9A (Prior Art)

Table 2: 2D-VLC Codewords

|  |  | \multicolumn{9}{c}{Runlength of preceding 0's} |
|---|---|---|---|---|---|---|---|---|---|---|
|  |  | 0 | 1 | 2 | 3 | 4 | 5 | 6 | . | . |
|  | 1 | C10 | C11 | C12 | C13 | C14 | C15 | C16 | . | . |
|  | 2 | C20 | C21 | C22 | C23 | C24 | C25 | C26 | . | . |
|  | 3 | C30 | C31 | C32 | C33 | C34 | C35 | C36 | . | . |
|  | 4 | C40 | C41 | C42 | C43 | C44 | C45 | C46 | . | . |
| Coeff. Amp. | 5 | C50 | C51 | C52 | C53 | C54 | C55 | C56 | . | . |
|  | 6 | C60 | C61 | C62 | C63 | C64 | C65 | C66 | . | . |
|  | 7 | C70 | C71 | C72 | C73 | C74 | C75 | C76 | . | . |
|  | 8 | C80 | C81 | C82 | C83 | C84 | C85 | C86 | . | . |
|  | 9 | C90 | C91 | C92 | C93 | C94 | C95 | C96 | . | . |
|  | . | . | . | . | . | . | . | . | . | . |
|  | . | . | . | . | . | . | . | . | . | . |
|  | . | . | . | . | . | . | . | . | . | . |

FIG. 9B (Prior Art)

VARIABLE LENGTH CODING FOR SPARSE COEFFICIENTS

RELATED PATENT APPLICATIONS

This invention claims priority of and is a continuation of U.S. patent application Ser. No. 11/346,757 filed Feb. 3, 2006 now U.S. Pat. No. 7,242,328 to inventors Chen, et al., titled "VARIABLE LENGTH CODING FOR SPARSE COEFFICIENTS,". The contents of U.S. patent application Ser. No. 11/346,757 are incorporated herein by reference.

The present invention is also related to the following commonly assigned U.S. patent applications:

U.S. patent application Ser. No. 10/342,537 to inventors Chen et al., filed Jan. 15, 2003 and titled AN EXTENSION OF TWO-DIMENSIONAL VARIABLE LENGTH CODING FOR IMAGE COMPRESSION. The aspects introduced herein that are also disclosed therein are referred to collectively and individually herein as the "Extended 2D-VLC Method" herein.

U.S. patent application Ser. No. 10/869,229, filed 15 Jun. 2004 to inventors Chen, et al., and titled "A HYBRID VARIABLE LENGTH CODING METHOD FOR LOW BIT RATE VIDEO CODING,". The aspects introduced herein that are also disclosed therein are referred to collectively and individually herein as the "Basic Hybrid VLC Method" herein.

U.S. patent application Ser. No. 10/898,654, filed 22 Jul. 2004 to inventors Chen, et al., and titled "AN EXTENDED HYBRID VARIABLE LENGTH CODING METHOD FOR LOW BIT RATE VIDEO CODING,". The aspects introduced herein that are also disclosed therein are referred to collectively and individually as the "Extended Hybrid VLC Method" herein.

U.S. patent application Ser. No. 10/910,712, filed 3 Aug. 2004 to inventors Chen, et al., and titled "VIDEO COMPRESSION USING MULTIPLE VARIABLE LENGTH CODING PROCESSES FOR MULTIPLE CLASSES OF TRANSFORM COEFFICIENT BLOCKS,". The aspects introduced herein that are also disclosed therein are referred to collectively and individually as the "Multiple-Class VLC Method" herein.

U.S. patent application Ser. No. 10/922,508, filed 18 Aug. 2004 to inventors Toebes, et al., and titled "TWO-DIMENSIONAL VARIABLE LENGTH CODING OF RUNS OF ZERO AND NON-ZERO TRANSFORM COEFFICIENTS FOR IMAGE COMPRESSION,". The aspects introduced herein that are also disclosed therein are referred to collectively and individually as the "2-D Non-Zero/Zero Cluster VLC Method" herein.

U.S. patent application Ser. No. 10/922,507, filed 18, Aug. 2004 to inventors Chen, et al., and titled "VIDEO CODING USING MULTI-DIMENSIONAL AMPLITUDE CODING AND 2-D NON-ZERO/ZERO CLUSTER POSITION CODING,". The aspects introduced herein that are also disclosed therein are referred to collectively and individually as the "Basic Multi-Dimensional Amplitude VLC Method" herein.

U.S. patent application Ser. No. 11/069,621, filed 28 Feb. 2005 to inventors Chen, et al., and titled "JOINT AMPLITUDE AND POSITION CODING FOR PHOTOGRAPHIC IMAGE AND VIDEO CODING,". The aspects introduced herein that are also disclosed therein are referred to collectively and individually as the "Joint Position and Amplitude VLC Method" herein.

U.S. patent application Ser. No. 11/069,620, filed 28 Feb. 2005 to inventors Wu, et al., and titled "ADAPTIVE BREAKPOINT FOR HYBRID VARIABLE LENGTH CODING,". The aspects introduced herein that are also disclosed therein are referred to collectively and individually as the "Adaptive Breakpoint Method" herein.

U.S. patent application Ser. No. 11/069,622, filed 28 Feb. 2005 to inventors Chen, et al., and titled "AMPLITUDE CODING FOR CLUSTERED TRANSFORM COEFFICIENTS,". The methods disclosed therein are referred to collectively and individually as the "Multi-Table Amplitude VLC Method" herein.

U.S. patent application Ser. No. 11/270,138, filed 9 Nov. 2005 to inventors Chen, et al., and titled "EXTENDED AMPLITUDE CODING FOR CLUSTERED TRANSFORM COEFFICIENTS,". The methods disclosed therein are referred to collectively and individually as the "Concatenated Amplitude Coding Method" herein.

The contents of each of the above related patent applications are incorporated herein by reference for all purposes.

BACKGROUND

Two-dimensional variable length coding (2D-VLC) includes collecting or assuming the statistics of two-dimensional block transform coefficient events that are each a run of the most likely-to-occur amplitude, e.g., 0, followed by a coefficient of another amplitude. The coding includes assigning variable length codewords, e.g., optimal codes such as Huffman codes or arithmetic codes, to each event. In the description herein, 0 is assumed to be the most likely-to-occur amplitude. The collecting of or assuming statistics includes tracking the quantized non-zero-valued coefficient amplitudes and the number of zero-valued coefficients preceding the non-zero amplitude, i.e., tracking the runlengths of zeros which precedes any non-zero amplitude along a specified path, e.g., a zigzag scan path for a block of coefficients, e.g., an 8 by 8 or a 16 by 16 coefficient block. FIG. 9A shows Table 1 that illustrates the statistics tabulated as a two dimensional table. In the table, Sij is the likelihood expressed, for example, as a relative number of occurrences of an amplitude of i, i=1, 2, . . . occurring after a run of j 0's, j=0,1, 2, . . . .

A variable length codeword such as an optimal code is then assigned to each of the events that have an Sij above, with the most likely-to-occur element—typically S10 for the case of encoding a block of transform coefficients in transform coding—having the shortest number of bits, and the least occurring event coded using the longest number of bits. FIG. 9B shows as Table 2 an exemplary 2D-VLC table. In the table, Cij is the codeword used to encode the event of the combination of j consecutive 0-valued coefficients followed by a single non-zero coefficient of amplitude i, j=0,1, . . . and i=1, 2, . . . .

2D-VLC is used in common transform coding methods such as JPEG, MPEG1, MPEG2, ITU-T-261, etc., as follows. For motion video, an image is divided into blocks, e.g., 8 by 8 or 16 by 16 blocks. Each image is classified as interframe or intraframe. Interframe images are typically post motion compensation. The blocks of the image are transformed and the transform coefficients are quantized. The quantized transform coefficients are then coded along a specified path according to a 2D-VLC table. Typically, interframe and intraframe images have different 2D-VLC tables. The DC component is typically separately encoded. Furthermore, the 2D-VLC table may be truncated so that the least frequently occurring events use an escape code followed by a fixed length code. A special "EOB" end-of-block code is used to indicate the end of a block when all remaining coefficients are zero.

Still images are similarly encoded, e.g., in the same manner as an intraframe image for motion video.

A table lookup may be used to implement a 2D-VLC scheme. Prior to the table look up, the runlength of zero amplitudes preceding any non-zero amplitude and the non-zero amplitude are determined. The table look up uses a 2D table for those likely events encoded using variable length encoding. An escape code together with a fixed length code is used for relatively less likely-to-occur combinations.

As an example, consider the following ordered sequence of quantized transform coefficients:

4 −3 1 0 −2 1 0 0 1 0 0 0 −1 0 0 . . . 0.

The coded bitstream using the 2DVL method can be represented by concatenating the following codewords:

C40+$S_+$+C30+$S_-$+C10+$S_+$+C21+$S_-$+C10+$S_+$+C12+$S_+$+C13+$S_-$+$C_{EOB}$.

where+ denotes concatenation, $S_+$ and $S_-$ represent positive and negative signs, respectively, and $C_{EOB}$ represents the end of block code.

The advantage of 2D-VLC is that both the position of each non-zero-valued coefficient as indicated by the runlength of pre-ceding zero-valued coefficients, and the quantized amplitude value are coded simultaneously as a pair using one 2D-VLC table. This may result in shorter codes on the average, i.e., codes that use fewer bits than using separate VLC tables for the position of each non-zero-valued coefficient and for its amplitude.

Because of the widespread use of image coding, many patents have been issued on different forms of VLC. U.S. Pat. No. 4,698,672 issued Oct. 6, 1987 to Wen-hsiung Chen, one of the inventors of the present invention, for example described one form of a two-dimensional variable length coding method.

Extensions and variations to the common 2D-VLC method are known. For example, the ITU H.263 compression standard defines one such variation sometimes called three-dimensional VLC (3D-VLC). See PCT patent publication WO 9318616 published Sep. 16, 1993 titled PICTURE DATA ENCODING METHOD and also the ITU-T H.263 standard. In 3D-VLC, each symbol ("event") is a triplet (LAST, RUN, LEVEL) that includes: LAST, a binary flag that indicates whether or not the current non-zero amplitude-value is the last non-zero coefficient in the block, RUN, the run-length of zero-value coefficients that precede the current non-zero amplitude, i.e., the number of zeroes since the last non-zero coefficient amplitude, and LEVEL, the current non-zero coefficient amplitude value. Thus, there is no need for a separate EOB codeword; whether or not the non-zero coefficient is the last one is incorporated into the event. A table lookup may be used to implement 3D-VLC.

One deficiency of 2D-VLC is that every non-zero-valued coefficient needs to be accompanied by a runlength code to identify its position, in the form of the number of preceding zero-valued coefficients.

Transform compression methods have been evolving over the years from simple intraframe coding to very sophisticated predictive coding including relatively sophisticated motion compensated interframe and intraframe coding. One result of such improvements is that more and more of the quantized transform coefficients have zero-value, and that non-zero values are more and more scattered along the encoding path. While the 2D-VLC generally performs well for a mixture of clustered and scattered coefficients the advantage of the coding starts to diminish as the quantized coefficients become more scattered. This is due to the fact that the code table for the 2D-VLC will need to become sufficiently large to cover the statistics of the diminishing clustered coefficients and, as a result, the length of the codewords in the 2D-VLC table becomes longer. Using longer codewords to code the sparsely distributed (scattered) coefficients is no longer efficient and desirable.

Thus there is a need in the art for improved methods for encoding a sequence of quantized transform coefficients as encountered in image compression, where non-zero-valued coefficients are scattered, and, in particular, sparse.

In block based transform coding, the inventors have observed that there often is a region, e.g., a low frequency region along the ordering in which non-zero-valued coefficients tend to cluster, i.e., there are often a number of consecutive non-zero-valued coefficients along the low frequency region of the pre-determined path. The Extended 2D-VLC Method of above referenced incorporated by reference U.S. patent application Ser. No. 10/342,537 includes encoding repetitions of some non-zero coefficient values. One variant of the Extended 2D-VLC method provides codewords for all the possible amplitude variations of consecutive coefficients that follow a set of zero-valued coefficients. This effectively reduced the runlength to 1 for all cases. The difficulty of this approach is that there are enormous numbers of patterns that can be generated from the amplitudes of consecutive coefficients. For example, with 32 quantization levels as defined in many common video coding standards, there are in the order of $32^n$ patterns that can be generated from n consecutive coefficients. As such, in a practical implementation, only a limited number of the most likely-to-occur non-zero amplitude values, such as 1 and 2, and a limited number of lengths of consecutive non-zero-values, such as 3 or 4 consecutive values, are regrouped for pattern matching.

Furthermore, in coding, while there may be a region where there are clusters of non-zero-valued coefficients, there is also likely to be a high frequency region where any non-zero-valued coefficients are likely to be scattered.

With these observations in mind, the Basic Hybrid VLC Method of above-mentioned incorporated by reference U.S. patent application Ser. No. 10/869,229 to inventors Chen et al. was developed to encode the position and amplitude of quantized transform coefficients separately and takes advantage of the nature of the distribution of the transform coefficients in the low frequency and high frequency regions.

In one embodiment of the above-mentioned Basic Hybrid VLC Method, two independent types of coding schemes are introduced to code the quantized coefficients along the path. A boundary is established along the path to define two regions, e.g., a low frequency region and a high frequency region. The boundary can be made adaptive to the video depending on a number of factors such as intraframe coding or interframe coding, standard definition television (SDTV) or high definition television (HDTV), complex scene or simple scene, high bit rate coding or low bit rate coding, and so forth. In one embodiment, the encoding of the quantized coefficients in the low-frequency region includes coding the positions of consecutive non-zero-valued coefficients and the positions of consecutive zero-valued coefficients using a run-length coding method of a first type and a run-length coding method of a second type. The encoding further includes coding the amplitude values and sign of the non-zero-valued coefficients. In the high-frequency region, in one embodiment, the encoding of coefficients in the high frequency region includes encoding the positions of either no consecutive zero-valued coefficients or runs of one or more consecutive zero-valued coefficients using a run-length coding method of a third type. The encoding further includes coding the amplitude values and sign of the non-zero-valued coefficients.

In one embodiment of the above-mentioned Extended Hybrid VLC Method, a coding method is used in the second region that takes into account that almost all non-zero-valued coefficients in the high frequency region are ±1. No amplitude coding is needed to encode runs of consecutive zeroes that end in a coefficient of amplitude 1. An exception (escape) code is included to encode those rare non-zero-valued coefficients that have values other than ±1.

The Extended Hybrid VLC Method of incorporated-by-reference U.S. patent application Ser. No. 10/898,654 provides an alternative coding method for the high frequency region by taking advantage of the very few amplitude values in the high frequency region, especially, for example, for low bit rate and interframe applications.

There still, however, is a need to improve improved methods for encoding the second region of the sequence of quantized transform coefficients, where non-zero-valued coefficients are scattered in, in particular, sparse.

Thus, there is a need in the art for improved methods for encoding a sequence of quantized transform coefficients as encountered in image compression in regions where non-zero-valued coefficients are scattered and sparse. This may be applicable to the whole sequence, or in different versions of hybrid coding, to only one, e.g., high frequency region.

SUMMARY

Described herein are a method, a carrier medium carrying computer readable instructions such as a computer program, the code to instruct a processor to execute the method, and an apparatus applicable for coding a series quantized transform coefficients as occur in image compression. Described herein is a computer-readable carrier medium carrying computer-readable codewords that are generated by the coding methods described herein.

An aspect of the present invention include a position coding method to code the position of clusters of consecutive non-zero-valued coefficients and an amplitude coding method to code the amplitudes in the clusters of non-zero-valued coefficients.

The method is applicable for coding an ordered series of quantized coefficients of a transform of image data in a first region—e.g., a low frequency region, or the whole region—of the series. Such a series occurs in many image compression methods. One aspect of the invention includes jointly encoding two or more clusters by amplitude coding the (longer) cluster that results from the concatenation of the two or more clusters. Encoding such longer cluster(s) can provide improved coding when using a code for the cluster that more efficiently encodes longer clusters than shorter clusters. The code for the positioning indicates the relative position of each cluster of non-zero-valued coefficients.

One embodiment is a method of processing an ordered series of digital signals that each have an amplitude from a finite set of amplitudes consisting of the most likely-to-occur amplitude and at least one other amplitude, the at least one other amplitude including a next most likely-to-occur amplitude to the most likely-to-occur amplitude. The processing is to reduce the amount of data used to represent the digital signals and to form codewords such that the relatively more likely-to-occur values or sequences of values of digital signals are represented by relatively short codewords and the relatively less likely-to-occur values or sequences of values of digital signals are represented by relatively long codewords.

According to one aspect of the invention, a method is provided that includes, for a contiguous region in a series of quantized transform coefficients, the region being, for example, the whole series, or a high-frequency region in the series, for each amplitude A, A=1, . . . , N of a subset of a number N of amplitude values, N≧1, the subset being the next-to-most likely-to-occur amplitude value if N=1, and, if N>1, the next-to-most likely-to-occur amplitude value and the next N−1 most likely to occur amplitude value or values:

(a) identifying events of a first kind that each includes an ending coefficient having amplitude A, and a run of "none or more" immediately preceding zero-value coefficients, i.e., either immediately preceded by a run of one or more consecutive zero-value coefficients, or immediately preceded by no zero-value coefficients. Each event is distinguished by the ending amplitude value, and by the run length of the run, including a length of zero.

For each A, the method includes:

(b) encoding the identified events of the first kind by respective codewords according to a variable length coding method corresponding to the ending amplitude value A. The variable length coding method jointly encodes the run length and the ending amplitude of identified events and is designed such that for at least some of the possible events, relatively more likely-to-occur events of the first kind are encoded by a shorter codeword than relatively less likely-to-occur events of the first kind.

The method further includes:

(c) identifying events of a second kind that each includes an ending coefficient having an amplitude >N preceded by a run of zero or more zero-valued coefficients, and (d) encoding the identified events of the second kind by respective codewords according to a second variable length coding method designed such that for at least some of the possible events of the second kind, relatively more likely-to-occur events of the second kind are encoded by a shorter codeword than relatively less likely-to-occur events of the second kind.

The method further includes:

(e) encoding, according to a third coding method, the coefficients in the concatenation of the coefficients having amplitudes >N. If the signs are separately encoded, then the third coding method only encodes the amplitudes.

Overall, the method is arranged such that relatively short codewords are formed to represent signal values or sequences of signal values that are relatively more likely-to-occur, and relatively long codewords are formed to represent signal values or sequences of signal values that are relatively less likely-to-occur.

Different versions of the method have different values of N, and/or different third coding methods for step (e).

A first variation of the step (e) is applicable for the amplitude values other than the amplitudes of the subset. Such amplitude values define a second subset including a most likely-to-occur second subset amplitude value. The step (e) includes:

(i) identifying events that includes a run of coefficients having the most likely-to-occur second subset amplitude value ending in a single amplitude value other than the most likely-to-occur second subset amplitude value, including the case of there being no immediately preceding coefficients having the most likely-to-occur second subset amplitude value, each event distinguished by its ending amplitude value, and by the greater or equal to zero run length of the run; and (ii) encoding the events identified in (i) by respective codewords according to a variable length coding method that jointly encodes the ending amplitude and the run length by a codeword such that for at least some of the possible events, relatively more likely-to-occur events are encoded by a shorter codeword than relatively less likely-to-occur events.

A second variation of step (e) includes recursively repeating steps (a), (b), (c), and (d) to a new sequence, each recursion's sequence being the concatenation of the coefficients having amplitudes other than the amplitudes of the previous recursion's subset, the repeating being until there are no more amplitude values to encode.

Another aspect of the invention is a computer readable carrier medium carrying a set of instructions to instruct one or more processors of a processing system to implement any one of the novel coding methods described herein.

Yet another aspect of the invention is a computer readable carrier medium carrying a signal containing a set of codewords representing an ordered series of coefficients, the codewords obtained by any one of the novel coding methods described herein.

Other aspects, features, advantages, and details are described in the description herein, and in the claims.

BRIEF DESCRIPTION OF THE DRAWINGS

FIG. 2A shows a code table, Table 3, for events that are recognized as part of the method embodiment described in FIG. 1.

FIG. 2B shows a code table, Table 4, for other events that are recognized as part of the method embodiment described in FIG. 1.

FIG. 4A shows a code table, Table 5, for events that are recognized as part of the method embodiment described in FIG. 3.

FIG. 4B shows a code table, Table 6, for other events that are recognized as part of the method embodiment described in FIG. 3.

FIG. 6A shows a code table, Table 7, for events that are recognized as part of the method embodiment described in FIG. 5 for the initial value of K=0.

FIG. 6B shows a code table, Table 8, for other events that are recognized as part of the method embodiment described in FIG. 5 for the value of K=2.

FIG. 6C shows a code table, Table 9, for other events that are recognized as part of the method embodiment described in FIG. 5 for the value of K=4.

FIG. 6D shows a code table, Table 10, for other events that are recognized as part of the method embodiment described in FIG. 5 for the general case of K.

FIG. 9A shows Table 1 that illustrates statistics tabulated as a two dimensional table.

FIG. 9B shows Table 2 that illustrates an example of a prior art 2D-VLC table.

DETAILED DESCRIPTION

Figure 1:
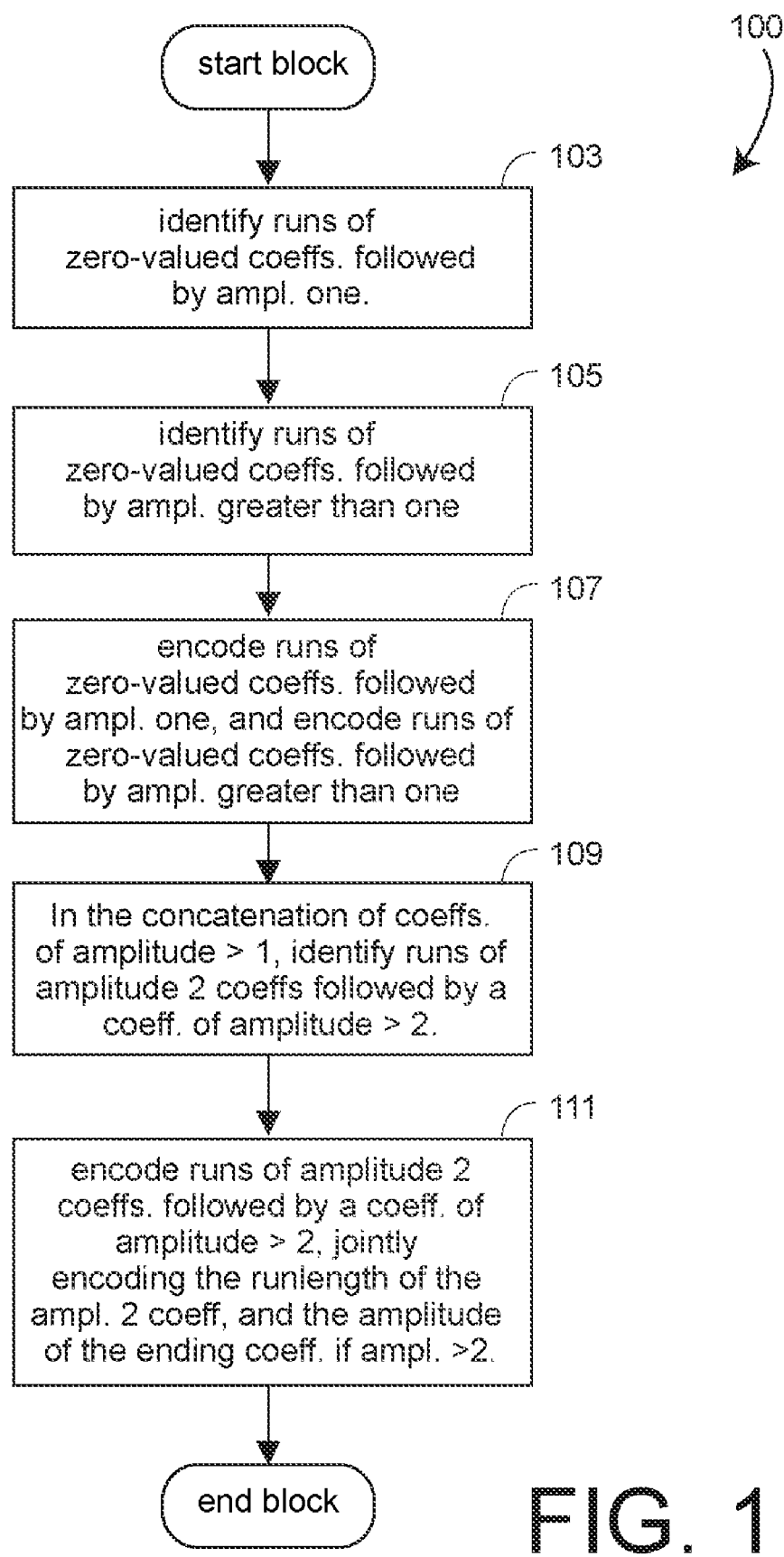
FIG. 1 shows a flow chart of one embodiment of a variable length coding (VLC) method.

Described herein are a method, a carrier medium storing computer readable instructions (a program) to cause a processor to execute the method, and an apparatus applicable for coding quantized transform coefficients as occur in image compression. The method is aimed at efficiently encoding sparsely distributed quantized transform coefficients as occur in image compression.

While the description is written in terms of an ordered series of digital values that are quantized transform coefficients of a block of image data, with zero-valued quantized coefficients being the most likely-to-occur, and quantized coefficients of value ±1 being the next most likely-to-occur values, the invention is, in general, applicable to an ordered series of digital signals that each have an amplitude from a finite set of amplitudes consisting of the most likely-to-occur amplitude and at least one other amplitude. How to modify any aspect of the invention described herein for the case of a series where a value other than 0 is the most likely-to-occur value or amplitude would be straightforward to those in the art.

One aspect of the invention includes significantly reducing the size of coding tables compared to conventional 2D-VLC coding tables by focusing on only a few low-valued non-zero-valued coefficients, and to use an efficient coding method to take care of the high valued coefficients as exception.

Note the term "none or more" is used herein for runlengths of a run of consecutive coefficients of a particular value that precedes a coefficient of some other amplitude value. Such a term is common in computer science, and means: the length of a run of one or more consecutive coefficients of the particular value if there are any immediately preceding coefficients of the particular amplitude value, or a length of 0 if there are no immediately preceding coefficients of the particular amplitude value.

A General Method Embodiment

According to one aspect of the invention, a method is provided that includes, for a contiguous region in a series of quantized transform coefficients, the region being, for example, the whole series, or a high-frequency region in the series, for each amplitude A, A=1, . . . , N of a subset of a number N of amplitude values, N≧1, the subset being the next-to-most likely-to-occur amplitude value if N=1, and, if N>1, the next-to-most likely-to-occur amplitude value and the next N−1 most likely to occur amplitude value or values:

(a) identifying events of a first kind that each includes an ending coefficient having amplitude A, and a run of "none or more" immediately preceding zero-value coefficients, i.e., either immediately preceded by a run of one or more consecutive zero-value coefficients, or immediately preceded by no zero-value coefficients. Each event is distinguished by the ending amplitude value, and by the run length of the run, including a length of zero.

For each A, the method includes:

(b) encoding the identified events of the first kind by respective codewords according to a variable length coding method corresponding to the ending amplitude value A. The variable length coding method jointly encodes the run length and the ending amplitude of identified events and is designed such that for at least some of the possible events, relatively more likely-to-occur events of the first kind are encoded by a shorter codeword than relatively less likely-to-occur events of the first kind.

The method further includes:

(c) identifying events of a second kind that each includes an ending coefficient having an amplitude >N preceded by a run of zero or more zero-valued coefficients, and (d) encoding the identified events of the second kind by respective codewords according to a second variable length coding method designed such that for at least some of the possible events of the second kind, relatively more likely-to-occur events of the second kind are encoded by a shorter codeword than relatively less likely-to-occur events of the second kind.

The method further includes:

(e) encoding, according to a third coding method, the coefficients in the concatenation of the coefficients having amplitudes >N. If the signs are separately encoded, then the third coding method only encodes the amplitudes.

Overall, the method is arranged such that relatively short codewords are formed to represent signal values or sequences of signal values that are relatively more likely-to-occur, and relatively long codewords are formed to represent signal values or sequences of signal values that are relatively less likely-to-occur.

Different versions have different values of N, and/or different third coding methods for step (e).

Examples and Variations

A first method embodiment is for N=1, and recognizes that zero-value is the most likely-to-occur value, and that 1 is the next most likely-to-occur amplitude value. The first method embodiment deals with amplitude-one, non-zero-valued coefficients, and differently with non-amplitude-one, non-zero-valued coefficients, and assumes that the bulk of non-zero-valued coefficients have an amplitude of one.

FIG. 1 shows a simplified flowchart of such a first method embodiment 100 for N=1 and includes in 103 recognizing events that include a run of consecutive zero-valued coefficients immediately followed by an amplitude-one coefficient, including an amplitude-one coefficient that is immediately preceded by no zero-valued coefficients, and also includes in 105 recognizing events that include a run of consecutive zero-valued coefficients immediately followed by a non-amplitude-one, non-zero coefficient, including a non-amplitude-one, non-zero coefficient immediately preceded by no zero-valued coefficients. In 107, the events are encoded, i.e., codewords are assigned to each recognized event based on measured or assumed statistics on the likelihood of occurrence of the events. The codewords are in general variable length codes such that for at least some of the events, relatively more likely-to-occur series of consecutive signal amplitudes are encoded by a shorter codeword than relatively less likely-to-occur series of consecutive signal amplitudes. Some of the least likely-to-occur events may have fixed length codes in order to limit the size of any code tables used.

FIG. 2A shows Table 3 that is a code table for such events. In Table 3, $^1C_n$ is the codeword for the event of n zero-valued coefficients followed by a single amplitude-one coefficient, where $n \geq 0$, and $^1C'_n$ the codeword for the event of n zero-valued coefficients is followed by a single non-amplitude-one, non-zero coefficient.

The method includes, in one embodiment, also encoding the signs of the ending amplitude 1, and of the ending non-amplitude 1 coefficients. This encodes the signs of all the non-zero coefficients.

The recognizing of events assigns codewords to all the amplitude 1 coefficients, and determines the positions of all the non-amplitude-one, non-zero coefficients. Because these positions are known, an encoding of the concatenation of all the non-amplitude-one, non-zero coefficients is now sufficient to complete the encoding.

Thus, the method includes in 109 recognizing events in the concatenation of coefficients of amplitude greater than 1 that include a run of consecutive amplitude-two coefficients immediately followed by a coefficient having amplitude greater than two, including no amplitude-two coefficients immediately preceding the coefficient of amplitude greater than two. In 111, two-dimensional variable length codewords are assigned to each recognized event based on measured or assumed statistics on the likelihood of occurrence of the events. The coding jointly encodes the runlength of the preceding consecutive amplitude-two coefficients, and the amplitude of the ending coefficient of amplitude greater than two. Note that this is similar to 2D VLC, except that instead of runs of zeroes, the runs of amplitude-two coefficients in the concatenation of all the non-zero-valued non-amplitude-one coefficients. The codewords are variable length codes such that for at least some of the events, relatively more likely-to-occur series of consecutive signal amplitudes are encoded by a shorter codeword than relatively less likely-to-occur series of consecutive signal amplitudes.

Note that the signs of all the coefficients in the concatenation do not need to be encoded in this embodiment because of the previous encoding of signs.

FIG. 2B shows Table 4 that is a code table for such events. In Table 4, $^1A_{an}$ denotes the codeword for the event of n amplitude-two coefficients followed by a single coefficient of amplitude a, $n \geq 0$, and $a > 2$.

Encoding an ordered sequence of quantized coefficients uses the two code tables Table 3 and Table 4, with the ordering according to a pre-determined path, e.g., a diagonal zig-zag path along the two-dimensional array of quantized transform coefficients. The coding includes first coding the coefficients of 1s and non-1s using Table 3, and then coding the amplitudes of the concatenation of the coefficients having amplitude >1 using the Table 4.

As an example, consider the following ordered sequence of quantized coefficients:

3 1 −1 0 2 0 −1 0 0 0 1 0 0 0 0 −2 0 0 1 0 . . . 0

Encoding of the coefficients of 1s and non-1s using the first table (Table 3) can then be represented by the concatenation of the following codewords:

$^1C'_0 + S_+ + ^1C_0 + S_+ + ^1C_0 + S_- + ^1C'_1 + S_+ + ^1C_1 + S_- + ^1C_3 + S_+ + ^1C'_4 + S_- + ^1C_2 + S_+ + ^1C_{EOB}$ where + denotes concatenation, $S_+$ and $S_-$ represent positive and negative signs, respectively, and $^1C_{EOB}$ represents the end of block code for Table 3. The concatenated coefficients having non-zero amplitudes other than one in this example are:

3 2 −2.

This concatenation is coded using the second table as:

$^1A_{30} + ^1A_{EOA2}$ where $^1A_{EOA2}$ represents the end of amplitude string 2.

Encoding of the coefficients in this example can therefore be represented by the following codewords:

$^1C'_0 + S_+ + ^1C_0 + S_+ + ^1C_0 + S_- + ^1C'_1 + S_+ + ^1C_1 + S_- + ^1C_3 + S_+ + ^1C'_4 + S_- + ^1C_2 + ^1C_{EOB} + ^1A_{30} + ^1A_{EOA2}$.

As another example, consider the following ordered sequence of quantized coefficients:

2 1 −1 0 2 0 −1 0 0 0 1 0 0 0 0 −3 0 0 1 . . .

Encoding of the coefficients can then be represented by concatenating the following codewords:

$^1C'_0+S_++^1C_0+S_++^1C_0+S_-+^1C'_1+S_++^1C_1+S_-+^1C_3+S_++$
$^1C'_4+S_-+^1C_2+S_++^1C_{EOB}+^1A_{23}$.

It should be noted that no $^1A_{EOA2}$ is needed in this example because $A_{23}$ has already encoded the last element of the concatenated non-amplitude-one coefficients 2 2 −3.

Note that while in these examples, the method of FIG. 1 has been applied to a region that is the whole sequence, in an alternate embodiment, at least one breakpoint is found that divides the sequence into a first, e.g., low-frequency region wherein non-zero-coefficients are clustered, and at least a second region where any non-zero coefficients are essentially scattered. The method of FIG. 1 is applied to the second, e.g., high frequency region. See the above-mentioned U.S. patent applications that describe the Basic Hybrid Method, and also the Multiple-Class VLC Method, the 2-D Non-Zero/Zero Cluster VLC Method, the Basic Multi-Dimensional Amplitude VLC Method, the Joint Position and Amplitude VLC Method, the Adaptive Breakpoint Method, the Multi-Table Amplitude VLC Method, and the Concatenated Amplitude Coding Method for different variations of the hybrid method, including methods suitable for encoding the first, e.g., low-frequency region. Note also that while some of the methods that are described in these incorporated-herein-by-reference patent applications are suitable for encoding the first region, the methods in such cited patent applications are in some circumstances also suitable for encoding the whole sequence.

Figure 3:
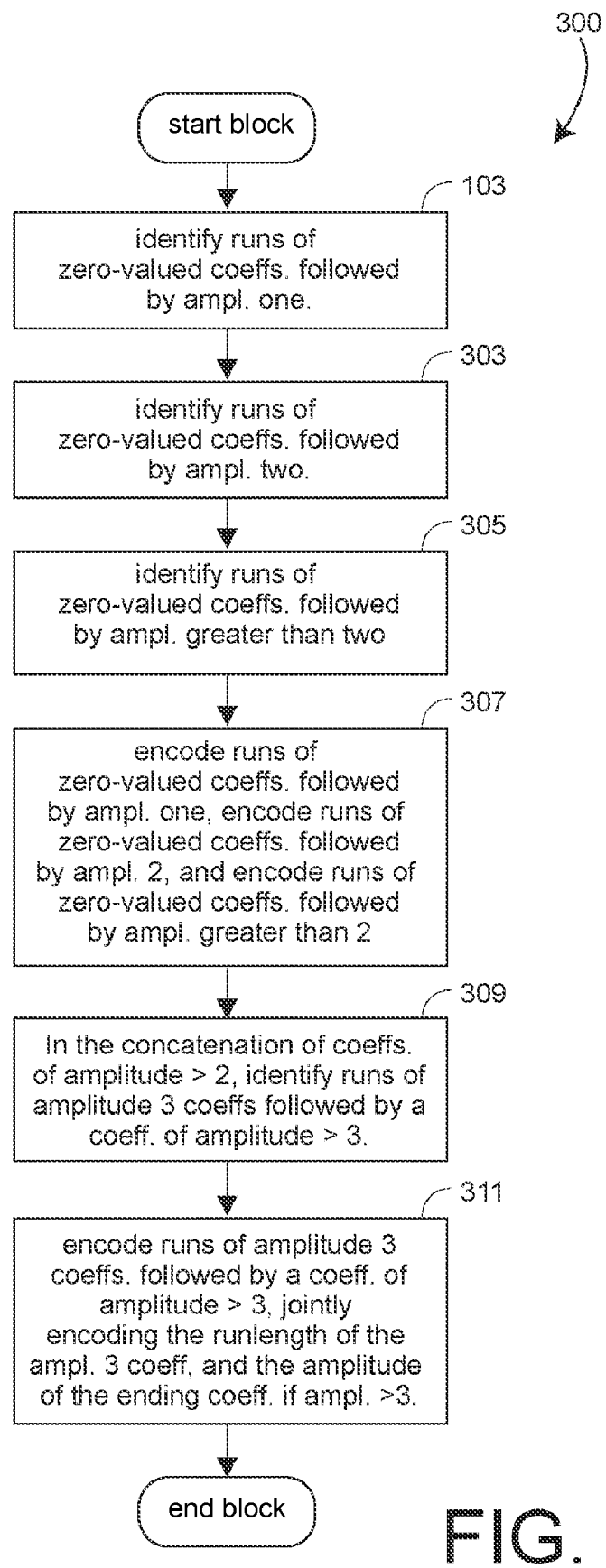
FIG. 3 shows a simplified flowchart of one example of a first alternate method embodiment to the embodiment described in the flowchart of FIG. 1.

A first alternate to the embodiment of FIG. 1 of a method of encoding a sequence, e.g., a sequence in which non-zero-valued coefficients are expected to be scattered, includes using a larger code table in place of Table 3 by increasing the number N of ending amplitudes of events of a run of none or more zero-valued coefficients followed by a single non-zero-valued coefficient. The second alternate version uses a modifying second table (was Table 4) to accommodate the increasing number of events. FIG. 3 shows a simplified flowchart 300 of one example, for N=2, of a first alternate method embodiment, in which, in 103, events are identified of any run of consecutive zero-valued coefficients followed by an amplitude-one coefficient, including a run of no zero-valued coefficients. In 303, events are identified of any run of consecutive zero-valued coefficients followed by an amplitude-two coefficient, including a run of no zero-valued coefficients, i.e., a run of none-or more such zero-valued coefficients. In the general case of N values, this is continued until events are identified of any run of none or more consecutive zero-valued coefficients followed by an amplitude-N coefficient. In the case of FIG. 3, in 305, events are identified of any run of none or more consecutive zero-valued coefficients followed by a coefficient of amplitude greater than two. In the general case, this would be a coefficient of amplitude greater than N. In 307, these events are encoded, e.g., by a coding table that provides a codeword. The codeword is a variable length code determined according to assumed or measured statistics of the likelihood of these identified events. The codewords are variable length codes such that for at least some of the events, relatively more likely-to-occur series of consecutive signal amplitudes are encoded by a shorter codeword than relatively less likely-to-occur series of consecutive signal amplitudes. In addition, the signs are encoded of the ending non-zero coefficients.

FIG. 4A shows Table 5 of a code table for these three types of events. In Table 5, $^1C_n$ denotes the codeword of an event of n zero valued coefficients followed by an amplitude 1 coefficient, $n \geq 0$, $^2C_n$ denotes the codeword for an event of n zero valued coefficients followed by an amplitude 2 coefficient, $n \geq 0$, and $^2C'_n$ denotes the codeword for an event of n zero valued coefficients followed by a coefficient of amplitude >2, $n \geq 0$. Note that because three types of events are encoded in Table 5, the codeword $^1C_n$ is not necessarily that same codeword in Table 3 for the same event The first alternate embodiment of the method includes in 309 recognizing events in the concatenation of coefficients of amplitude greater than 2 (in general, greater than N) that include a run of consecutive amplitude-three coefficients (in general, N+1) immediately followed by a coefficient having amplitude greater than three (in general, greater than N+1), including no amplitude-three coefficients immediately preceding the coefficient of amplitude greater than three. In 311, variable length codes are assigned to each recognized event based on measured or assumed statistics on the likelihood of occurrence of the events. The coding jointly encodes the runlength of the preceding consecutive amplitude 3 coefficients (in general, >N+1), and the amplitude of the ending coefficient of amplitude greater than 3. Note that this is similar to 2D-VLC, except that instead of runs of zeroes, the runs of amplitude 3 coefficients in the concatenation of all the non-zero-valued coefficients of amplitude greater than 2. The codewords are variable length codes such that for at least some of the events, relatively more likely-to-occur series of consecutive signal amplitudes are encoded by a shorter codeword than relatively less likely-to-occur series of consecutive signal amplitudes.

Note that the signs of the coefficients in the concatenated coefficients do not need to be encoded because, in this embodiment, the signs are encoded in the encoding of the runs of none or more zero-valued coefficients followed by a single non-zero amplitude coefficient using the first table (Table 5).

FIG. 4B shows Table 6 that is a code table for such events. In Table 6, $^6A_{an}$ denotes the codeword for the event on n amplitude 3 coefficients followed by a single coefficient of amplitude a, $n \geq 0$, and a>3.

Encoding an ordered sequence of quantized coefficients uses the two code tables Table 5 and Table 6, with the ordering according to a pre-determined path, e.g., a diagonal zig-zag path along the two-dimensional array of quantized transform coefficients. The coding includes first coding the coefficients of 1s, 2s and >2s using Table 5, and then coding the amplitudes of the concatenation of the coefficients having amplitude >2 using Table 6.

As an example, the following ordered sequence of quantized coefficients:

3 1 −1 0 2 0 −1 0 0 0 1 0 0 0 0 −2 0 0 1 0 . . . 0 can be represented by the following codewords:

$^2C'_0+S_++^1C_0+S_++^1C_0+S_-+^2C_1+S_++^1C_1+S_-+^1C_3+S_++$
$^2C_4+S_-+^1C_2+S_++^2C_{EOB}+^2A_{EOA3}$.

where $S_-$ and $S_+$ are as above, $^2C_{EOB}$ denoted the end of block code for Table 5 of FIG. 4A, and $^2A_{EOA3}$ denoted the end code for using Table 6 of FIG. 4B.

Thus, in different versions of the first alternate embodiment method, for different values of N, $N \geq 2$, at least one type of event is recognized of a run of zero-valued coefficients followed by a single amplitude, different types being different values 1, 2, . . . , N of the possible amplitudes, the different values forming a subset of amplitudes. Additionally, events are recognized of a run of consecutive zero-valued coefficients followed by a non-zero coefficient of an amplitude not in the subset of amplitudes, i.e., of an amplitude >N. All recognized events are then coded. In one embodiment, a code table for such events is used for the coding, e.g., code Table 2A or code Table 4A. The coefficients of an amplitude not in the subset of non-zero amplitudes have the most likely-tooccur amplitude, e.g., the lowest amplitude. Events are also recognized in the concatenation of all non-zero coefficients of an amplitude not in the subset of amplitudes, of runs of consecutive coefficients having such most likely-to-occur amplitude, followed by a single coefficient of an amplitude other than such most likely-to-occur amplitude. These events are defined by the length of the run of coefficients of such most likely-to-occur amplitude, including no run of no such coefficients indicated by runlength 0, and by the amplitude of the ending coefficient. These events are encoded by a variable length codeword according to assumed or measured statistics. In one embodiment, such encoding is by a coding Table, e.g., code Table 2B or code Table 4B. Furthermore, the signs of the coefficients in the concatenation are encoded.

Again, this coding can be applied to the whole sequence of coefficients, or, in a hybrid coding method, to one region, e.g., the high frequency region, where the non-zero coefficients are likely to be scattered and sparse.

A second alternate method embodiment, in the general case of an initial subset of N amplitude values, includes, as the third coding method of step (e) (See "A general method embodiment" above), recursively repeating steps (a), (b), (c), and (d) to a new sequence, each recursion's sequence being the concatenation of the coefficients having amplitudes other than the amplitudes of the previous recursion's subset, the repeating being until there are no more amplitude values to encode. In each recursion, the subset is of at most N amplitude values, since, in the last recursion, it may be that there are fewer than N amplitude values left in the remaining concatenation.

Figure 5:
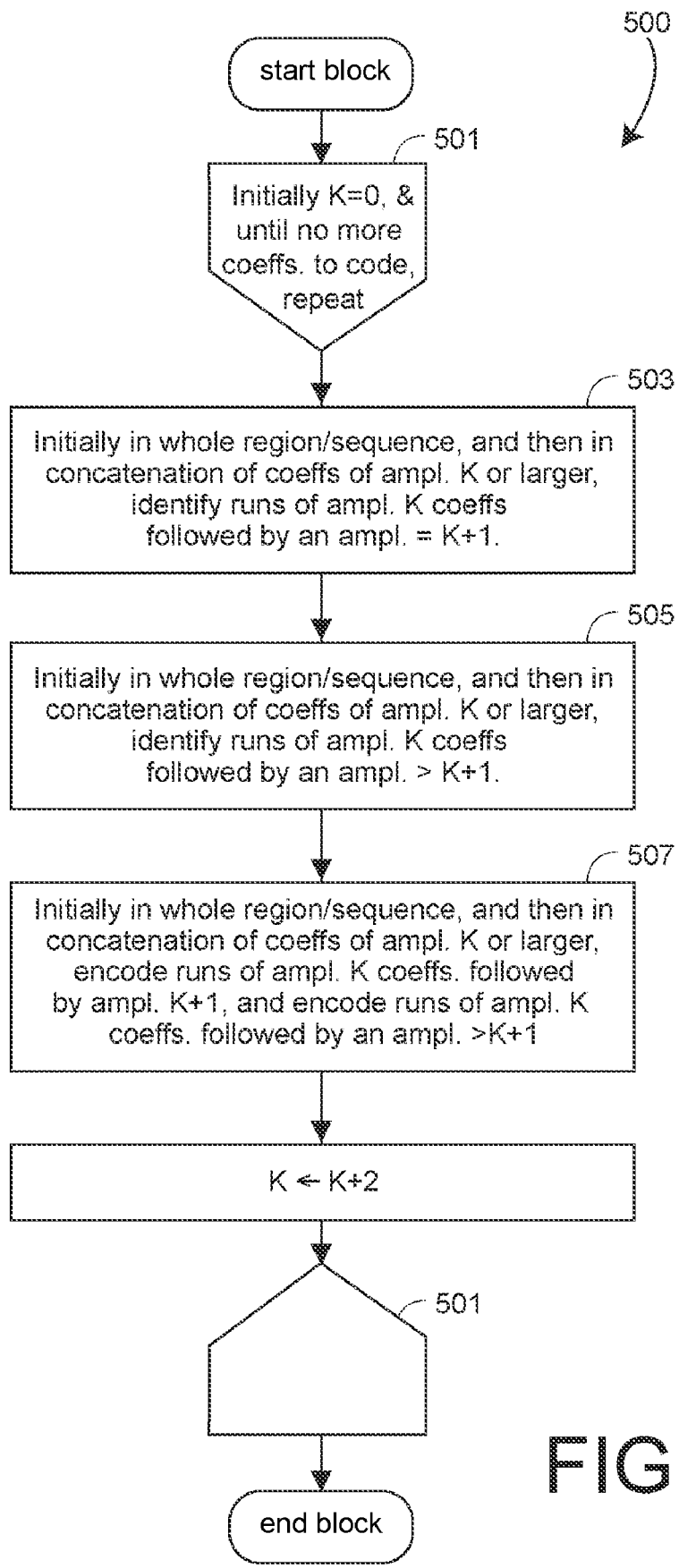
FIG. 5 shows a simplified flowchart of one example of a second alternate method embodiment to the embodiment described in the flowchart of FIG. 1, including recognizing events in a concatenation of all coefficients of amplitude K or more.

As an example of the second alternate method embodiment for the case of N=1, the method repeats the encoding method described by blocks 103, 105, and 107 of the flowchart of FIG. 1 recursively to the series of the concatenations of the coefficients of amplitudes not yet encoded, until all coefficients are encoded. FIG. 5 shows a flowchart of one such second alternative method embodiment 500. In 501, initially the run amplitude, denoted K, is set to 0 and 503,505, and 507 are repeated until there are no more coefficients to code. 503, 505, and 507 are carried out initially in the whole sequence, or region for the case of hybrid coding, and after, e.g., for K=2, 4, . . . , in a concatenation of all coefficients of amplitude K or more. In 503, events are identified each of a run of consecutive amplitude K (initially zero) coefficients followed by a single coefficient of amplitude K+1 (initially 1), including a run of 0 amplitude K (initially zero) coefficients followed by a single coefficient of amplitude K+1. In 505, events are identified each of a run of consecutive amplitude K (initially zero) coefficients followed by a single coefficient of amplitude greater than K+1 (initially greater than 1), including a run of 0 amplitude K (initially zero) coefficients followed by a single coefficient of amplitude greater than K+1. In 507, these events are encoded, e.g., using a code table, with variable length codes, e.g., determined from assumed or measured statistics. The codewords are variable length codes such that for at least some of the events, relatively more likely-to-occur series of consecutive signal amplitudes are encoded by a shorter codeword than relatively less likely-to-occur series of consecutive signal amplitudes.

One embodiment includes, at the end of the first recursion, i.e., the recursion with K=0, encoding the signs of the single coefficient of amplitude $\geq 0$. No further sign encoding is then needed.

FIG. 6A shows code Table 7 for the initial value of K=0, where $^1 C_n$ is the codeword for the event of n zero-valued coefficients followed by a single amplitude-one coefficient, $n \geq 0$, and $^1 C'_n$ is the codeword for the event of n zero-valued coefficients followed by a single non-amplitude-one non-zero coefficient. FIG. 6B shows code Table 8 for the value of K=2, where $^3 C_n$ is the codeword for the event of n coefficients of amplitude 2 followed by a single amplitude-three coefficient, where $n \geq 0$, and $^3 C'_n$ is the codeword for the event of n coefficients of amplitude 2 followed by a single amplitude-3 non-zero coefficient. FIG. 6C shows code Table 9 for the value of K=4, where $^5 C_n$ is the codeword for the event of n coefficients of amplitude 4 followed by a single amplitude-5 coefficient, where $n \geq 0$, and $^5 C'_n$ is the codeword for the event of n coefficients of amplitude 4 followed by a single amplitude-5, non-zero coefficient. FIG. 6D shows the general code Table 10 for the value denoted by K, where $^K C_n$ is the codeword for the event of n coefficients of amplitude K followed by a single amplitude-(K+1) coefficient, where $n \geq 0$, and $^K C'_n$ is the codeword for the event of n coefficients of amplitude K followed by a single amplitude-(K+1), non-zero coefficient.

Note that while FIG. 5 shows the recognizing of events and coding of the events for different values of K occurring sequentially, one embodiment includes carrying out in parallel the processes for each value of K: 0, 3, 5, . . . , as necessary to encode all the coefficients. That is, there is no need to wait until all the codewords for the runs of zero-valued coefficients ending in 1 and in an amplitude greater than one before commencing the encoding in the concatenation of coefficients of amplitude greater than one of runs of none or more amplitude-two coefficients followed by an amplitude 3 coefficient or followed by other than an amplitude 3 coefficient.

In another embodiment, the encoding of the sequence of coefficients (or, in hybrid coding, of a region thereof) is carried out by a method that combines the features of the first alternate embodiment, and the second alternate embodiment. That is, N>1 and the recursion is used for the coding of the runs with amplitudes >N.

As an example, suppose that each iteration denoted by K, starting with K=0, of the second alternate embodiment includes recognizing events of a number, including none, of amplitude K coefficients followed by a single amplitude K+1 coefficient, or a number, including none, of amplitude K coefficients followed by a single amplitude K+2 coefficient, . . . , or, a number, including none, of amplitude K coefficients followed by a single coefficient of amplitude K+N, or a number, including none, of amplitude K coefficients followed by a single coefficient of amplitude greater than K+N, where N is some integer greater or equal to 2.

Then, for the first iteration, in one embodiment, each recognized event is encoded by looking up a codeword such as Table 7, but with a N+1 rows as follows: events ending in a single coefficient of amplitude 1, events ending in a single coefficient of amplitude 2, . . . , events ending in a single coefficient of amplitude N, and events ending in a single coefficient of amplitude greater than N. The next iteration is for K=N. The next iteration if for K=2N, and so forth.

In a practical system using any of the above variations, the size of the code tables is limited by using fixed codes for relatively unlikely events. Each of a set of less frequently occurring events is encoded with a relatively long, fixed-length codeword, and the other, relatively more frequent events are each encoded with a variable length codeword. An escape code at the beginning of the codeword is used to indicate the fixed-length codewords of the relatively infrequent events. How to modify the tables shown herein to limit the size to include escape codes would be clear to those in the art. Such a technique is common, for example, in traditional 2D-VLC.

The above-described embodiments include encoding the signs of each non-zero coefficient using a sign bit, the encoding being during the encoding of runs of zero-valued coefficients followed by a single non-zero-valued coefficient.

According to an alternate embodiment, the encoding of the signs of the coefficients includes encoding the sequence of signs of all the non-zero coefficients to produce a separate sign codeword for all the signs. Only the non-zero coefficients are encoded. Such encoding can be done only according to relative positioning of the non-zero coefficients, and irrespective of the actual position of the non-zero coefficients. Thus, one set of alternate sign encoding variations includes encoding the series of quantized coefficients ignoring sign, and then separately concatenating sign codes for the signs the non-zero amplitude coefficients.

Other alternate methods of encoding the sign also are possible. For example, the tables that determine the position of the non-zero-valued coefficients, e.g., Table 3, Table 5, or Table 7 can be modified to include the sign of the non-zero-valued amplitudes. This requires doubling the length of the code tables, which, assuming positive and negative non-zero coefficients are equally likely, means a codeword having an additional bit in length.

Apparatus

Figure 7:
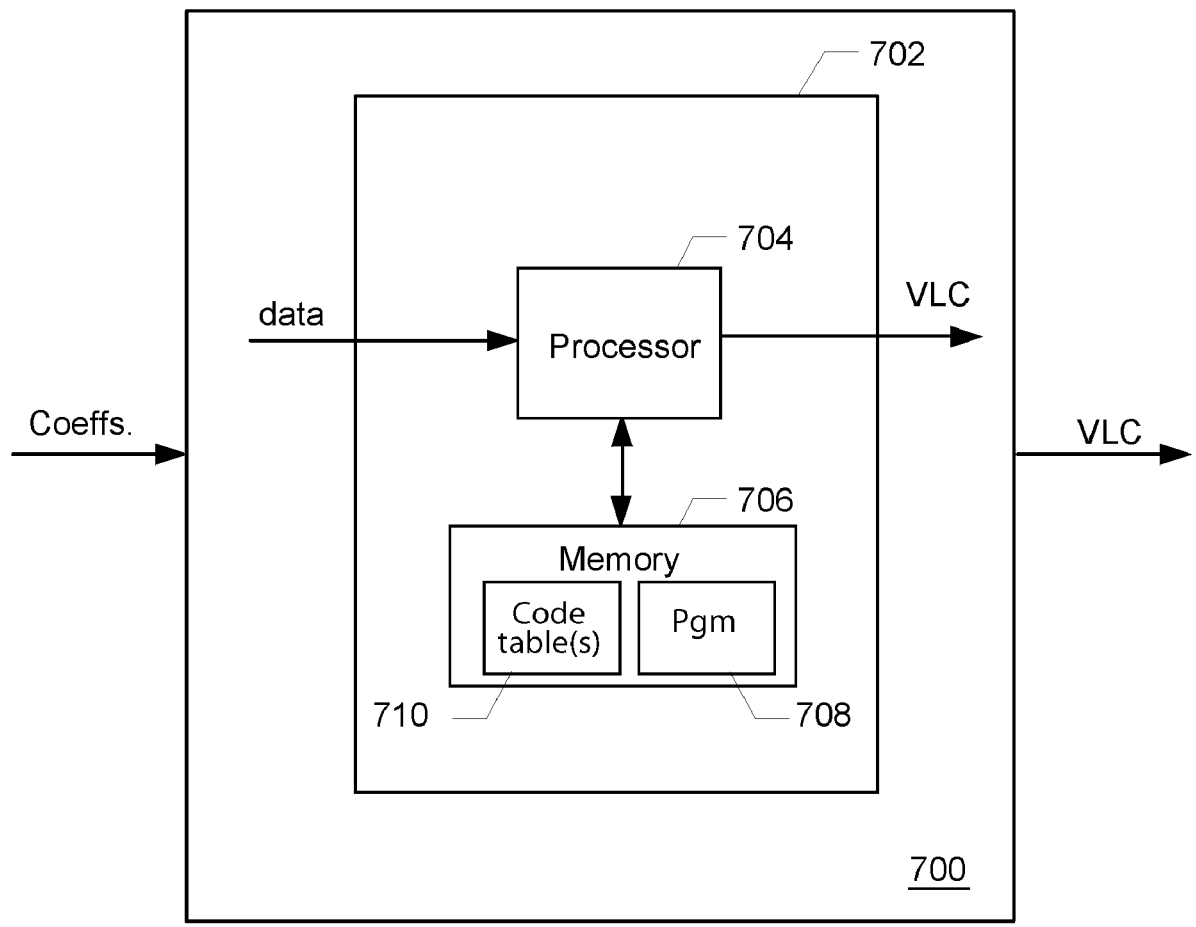
FIG. 7 shows an apparatus for coding a series of digital signals, e.g., an ordered series of quantized coefficients of a transformed block of image data, including a processing system that has a memory containing code that implements an embodiment of the coding method described herein.

Another aspect of the invention is an apparatus for coding a series of digital signals, e.g., an ordered series of quantized coefficients of a transformed block of image data. FIG. 7 shows an apparatus 700 that includes a processing system 702 that includes one or more processors 704 and a memory 706. A single processor is shown in FIG. 7 and those in the art will appreciate that this may represent several processors. Similarly, a single memory subsystem 706 is shown, and those in the art will appreciate that the memory subsystem may include different elements such as RAM, ROM, and so forth. In addition, the memory subsystem is meant to include any non-volatile memory storage such as a magnetic or optical storage component. A computer program 708 is included and is loaded into the memory 706. Note that at any time, some of the program may be in different parts of the memory subsystem, as will be understood by those in the art. The program 708 includes instructions to instruct the processor to implement, in different versions, the different coding methods described above. The processor thus accepts as data the ordered coefficients and generates the codewords. The apparatus 700 further includes in the memory subsystem 706 a coding data structure 710 that provides the codewords for sets of one or more coefficients as described in any one of the novel coding methods described herein. In one embodiment, the data structure is in the form of the above-described coding tables.

Note that FIG. 7 does not show details such as bus structures, I/O structures, etc., that may be included since the need for such structures would be known to those in the art and their inclusion would only obscure the inventive aspects of the apparatus. Furthermore, the processing system may be implemented using one or more general purpose microprocessors, one or more microcontrollers that include several memory and other elements, one or more DSP devices, or any other programmable processors. Furthermore, the processors may be standalone devices, or may be implemented as "cores" to be included in an ASIC, gate array, or other device.

Another aspect of the invention is a memory (such as memory 706 in FIG. 7) that stores a coding data structure that provides the codewords for sets of one or more coefficients as described in any one of the novel coding methods described herein. In one embodiment, the data structure is in the form of one or more coding tables.

Another aspect of the invention is a computer readable carrier medium carrying a set of instructions to instruct one or more processors of a processing system to implement any one of the novel coding methods described herein.

Yet another aspect of the invention is a computer readable carrier medium carrying a signal containing a set of codewords representing an ordered series of coefficients, the codewords obtained by any one of the novel coding methods described herein.

Thus, a variable length coding method and apparatus has been described suitable for encoding the quantized transform coefficients of blocks of images as occur in common image compression methods.

Another aspect of the invention is a method to decode a bitstream in order to form a series of quantized coefficients of a transform of a block of image data, the transform such that 0 is the most likely coefficient amplitude and 1 is the next most likely coefficient amplitude. The bitstream is encoded by the coding method(s) described above including, for a particular contiguous region in the series, for each amplitude A of a subset of a number $N \geq 1$ of the amplitude values 1, . . . , N, identifying events of a first kind that each includes an ending coefficient having the amplitude A immediately preceded by a run of none or more consecutive zero-valued coefficients, encoding the identified events of the first kind by respective codewords according to a variable length coding method corresponding to the ending amplitude value, identifying events of a second kind that include a single ending coefficient having an amplitude $\geq N$ immediately preceded by a run of none or more zero valued coefficients, encoding the identified events of the second kind by respective codewords according to a second variable length coding method, and encoding according to a third coding method the series of coefficients in the concatenation of the coefficients having amplitudes other than the amplitudes of the subset, such that relatively short codewords are formed to represent values or sequences of values that are relatively more likely-to-occur, and relatively long codewords are formed to represent values or sequences of values that are relatively less likely-to-occur. The method is applicable to encoding a region in the series where there is likely to be scattered non-zero-valued coefficients.

The decoding method includes for a sequence of codewords recognizing codewords that have been obtained by the coding method(s) described above including, for a particular contiguous region in the series, for each amplitude A of a subset of a number $N \geq 1$ of the amplitude values 1, . . . , N, identifying events of a first kind that each includes an ending coefficient having the amplitude A immediately preceded by a run of none or more consecutive zero-valued coefficients, encoding the identified events of the first kind by respective codewords according to a variable length coding method corresponding to the ending amplitude value, identifying events of a second kind that include a single ending coefficient having an amplitude $\geq N$ immediately preceded by a run of none or more zero valued coefficients, encoding the identified events of the second kind by respective codewords according to a second variable length coding method, and encoding according to a third coding method the series of coefficients in the concatenation of the coefficients having amplitudes other than the amplitudes of the subset.

Figure 8:
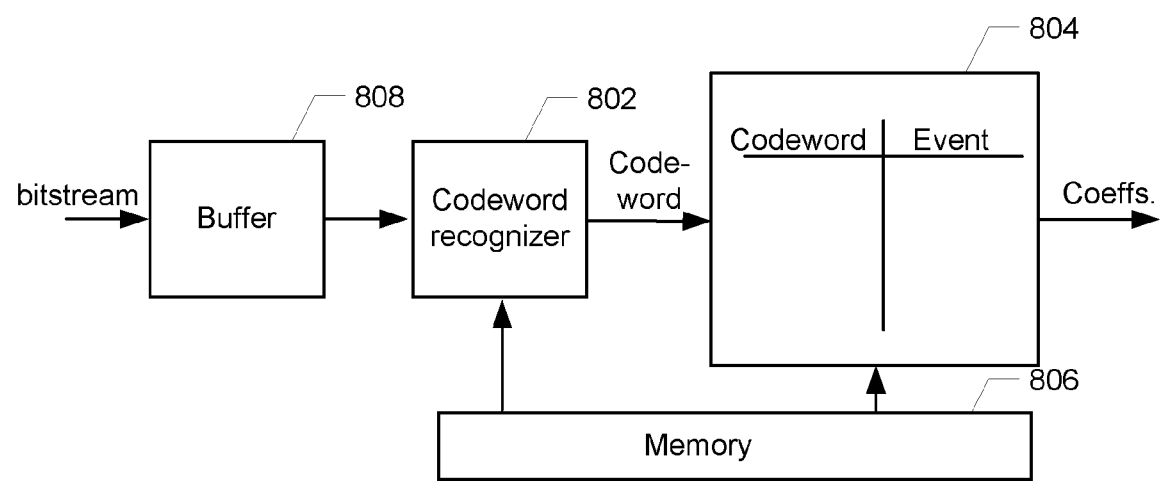
FIG. 8 shows an apparatus embodiment for decoding a bitstream representing a series of codewords encoded according to one or more aspects of the present invention.

Another aspect of the invention is an apparatus for decoding a bitstream encoded by any of the methods described herein. FIG. 8 shows one embodiment of the apparatus. A codeword recognizer 802 accepts the bits of a bitstream and recognizes a codeword of a set of possible codewords. The codeword recognizer determines which of the set of coding tables the codeword is from. A decoder 804 is coupled to the codeword recognizer 802 and determines the data for the codeword recognized by the codeword recognizer. In one embodiment, the decoder 804 includes a lookup device that looks up the appropriate decoding table stored in a memory 806. That table provides the event that corresponds to at least some of the codewords of the set of codewords, or sign information. Other codewords may include an escape code, so that decoding is by other than a table lookup method. In one embodiment, the bitstream is stored in a buffer 808, and the output of the buffer is coupled to the codeword recognizer. The apparatus for decoding implements a codeword decoding method that includes for a sequence of codewords recognizing codewords that have been obtained by the coding method(s) described above including, for a particular contiguous region in the series, for each amplitude A of a subset of a number $N \geq 1$ of the amplitude values $1, \ldots, N$, identifying events of a first kind that each includes an ending coefficient having the amplitude A immediately preceded by a run of none or more consecutive zero-valued coefficients, encoding the identified events of the first kind by respective codewords according to a variable length coding method corresponding to the ending amplitude value, identifying events of a second kind that include a single ending coefficient having an amplitude $\geq N$ immediately preceded by a run of none or more zero valued coefficients, encoding the identified events of the second kind by respective codewords according to a second variable length coding method, and encoding according to a third coding method the series of coefficients in the concatenation of the coefficients having amplitudes other than the amplitudes of the subset.

While in the embodiment shown in FIG. 8, the memory is shown separate from the lookup device, those in the art will understand that in other embodiments, the lookup device includes memory for the tables, and such other embodiments are included herein.

Note further that in FIG. 8, the codeword recognizer and also the lookup device may be each implemented on a computer as a set of instructions stored in a memory, e.g., the memory 806, that instructs one or more processors to carry out the operations of the recognition and of the lookup.

Another aspect of the invention is a memory (such as memory 806 in FIG. 8) that stores a decoding data structure that provides the data for any set of codewords recognized in a bitstream of compressed image data. The bitstream is coded by any one of the novel coding methods described herein. In one embodiment, the data structure is in the form of one or more tables.

The coding and decoding methodologies described herein are, in one embodiment, performable by a machine which includes a one or more processors that accept instructions. For any of the methods described herein, when the instructions are executed by the machine, the machine performs the method. Any machine capable of executing a set of instructions (sequential or otherwise) that specify actions to be taken by that machine are included. Thus, one typical machine may be exemplified by a typical processing system that includes one or more processors. Each processor may include one or more of a CPU, a graphics processing unit, and a programmable DSP unit. The processing system further may include a memory subsystem including main RAM and/or a static RAM, and/or ROM. A bus subsystem may be included for communicating between the components. If the processing system requires a display, such a display may be included, e.g., a liquid crystal display (LCD) or a cathode ray tube (CRT) display. If manual data entry is required, the processing system also includes an input device such as one or more of an alphanumeric input unit such as a keyboard, a pointing control device such as a mouse, and so forth. The term memory unit as used herein also encompasses a storage system such as a disk drive unit. The processing system in some configurations may include a sounds output device, and a network interface device. The memory subsystem thus includes a carrier medium that carries machine readable instructions (e.g., software) including instructions for performing, when executed by the processing system, one of more of the methods described herein. The software may reside in the hard disk, or may also reside, completely or at least partially, within the RAM and/or within the processor during execution thereof by the computer system. Thus, the memory and the processor also constitute carrier medium carrying machine readable instructions.

In alternative embodiments, the machine operates as a standalone device or may be connected, e.g., networked to other machines, in a networked deployment, the machine may operate in the capacity of a server or a client machine in a server-client network environment, or as a peer machine in a peer-to-peer or distributed network environment. The machine may be a personal computer (PC), a tablet PC, a set-top box (STB), a Personal Digital Assistant (PDA), a cellular telephone, a web appliance, a network router, switch or bridge, or any machine capable of executing a set of instructions (sequential or otherwise) that specify actions to be taken by that machine.

Note that while some diagram(s) only show(s) a single processor and a single memory that carries the instructions, those in the art will understand that many of the components described above are included, but not explicitly shown or described in order not to obscure the inventive aspect. For example, while only a single machine is illustrated, the term "machine" shall also be taken to include any collection of machines that individually or jointly execute a set (or multiple sets) of instructions to perform any one or more of the methodologies discussed herein.

Thus, one embodiment of each of the methods described herein is in the form of a computer program that executes on a processing system, e.g., one or more processors that are part of an image encoder. Thus, as will be appreciated by those skilled in the art, embodiments of the present invention may be embodied as a method, an apparatus such as a special purpose apparatus, an apparatus such as a data processing system, or a carrier medium, e.g., a computer program product. The carrier medium carries one or more computer readable instructions for controlling a processing system to implement a method. Accordingly, aspects of the present invention may take the form of a method, an entirely hardware embodiment, an entirely software embodiment or an embodiment combining software and hardware aspects. Furthermore, the present invention may take the form of carrier medium (e.g., a computer program product on a computer-readable storage medium) carrying computer-readable program instructions embodied in the medium.

The software may further be transmitted or received over a network via the network interface device. While the carrier medium is shown in an exemplary embodiment to be a single medium, the term "carrier medium" should be taken to include a single medium or multiple media (e.g., a centralized or distributed database, and/or associated caches and servers) that store the one or more sets of instructions. The term "carrier medium" shall also be taken to include any medium that is capable of storing, encoding or carrying a set of instructions for execution by the machine and that cause the machine to perform any one or more of the methodologies of the present invention. A carrier medium may take many forms, including but not limited to, non-volatile media, volatile media, and transmission media. Non-volatile media includes, for example, optical, magnetic disks, and magneto-optical disks. Volatile media includes dynamic memory, such as main memory. Transmission media includes coaxial cables, copper wire and fiber optics, including the wires that comprise a bus subsystem. Transmission media also may also take the form of acoustic or light waves, such as those generated during radio wave and infrared data communications. For example, the term "carrier medium" shall accordingly be taken to include, but not be limited to, solid-state memories, optical and magnetic media, and carrier wave signals.

It will be understood that the steps of methods discussed are performed in one embodiment by an appropriate processor (or processors) of a processing (i.e., computer) system executing instructions stored in storage. It will also be understood that the invention is not limited to any particular implementation or programming technique and that the invention may be implemented using any appropriate techniques for implementing the functionality described herein. The invention is not limited to any particular programming language or operating system.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment. Furthermore, the particular features, structures or characteristics may be combined in any suitable manner, as would be apparent to one of ordinary skill in the art from this disclosure, in one or more embodiments.

Similarly, it should be appreciated that in the above description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the Detailed Description are hereby expressly incorporated into this Detailed Description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method or a means for carrying out the method or element of a method. Furthermore, an element described herein of an apparatus embodiment is an example of a means for carrying out the function performed by the element for the purpose of carrying out the invention.

It should further be appreciated that although the invention has been described in the context of transform encoding of images, the invention is not limited to such contexts and may be utilized in various other compression applications and systems. Furthermore, the invention is not limited to any one type of architecture or type of transform encoding. For example, the DCT is mentioned above as one transform. Other transforms may be used, e.g., the new H.264/MEG-4 AVC video coding standard/draft standard defines 4×4 blocks and a DCT-like 4×4 integer transform. The invention does not depend on any particular type of interframe coding if used, or of motion compensation if used for interframe coding, or any intra-estimation if used for estimating the pixels of a block using information from neighboring blocks.

Note that variable length coding is sometimes referred to as entropy coding or statistical coding.

Note that in one embodiment for amplitude encoding, 127 possible non-zero values are possible for the coefficients. The invention however is not restricted to any number of possible quantization values.

Note also that the term amplitude is irrespective of sign. Therefore, for example, coefficient of values +1 and −1 both have amplitude 1.

Note that the terms coding and encoding are used interchangeably herein.

Note also that the present invention does not depend on the particular type of VLC used for any of the coding methods, e.g., the coding tables, and can work, for example, with Huffman coding and with arithmetic coding methods. Furthermore, while embodiments have been described that used fixed encoding for the events based on assumed or a priori likelihoods of occurrence of the events (also called the symbols), i.e., the likelihoods of occurrence of the events do not change, other embodiments use adaptive encoding, i.e., the encoding is changeable according to statistical data such as histograms collected from the actual coefficients.

All publications, patents, and patent applications cited herein are hereby incorporated by reference.

In the claims below and the description herein, any one of the terms comprising, comprised of or which comprises is an open term that means including at least the elements/features that follow, but not excluding others. Thus, the term comprising, when used in the claims, should not be interpreted as being limitative to the means or elements or steps listed thereafter. For example, the scope of the expression a device comprising A and B should not be limited to devices consisting only of elements A and B. Any one of the terms including or which includes or that includes as used herein is also an open term that also means including at least the elements/features that follow the term, but not excluding others. Thus, including is synonymous with and means comprising.

Similarly, it is to be noted that the term coupled, when used in the claims, should not be interpreted as being limitative to direct connections only. Thus, the scope of the expression a device A coupled to a device B should not be limited to devices or systems wherein an output of device A is directly connected to an input of device B. It means that there exists a path between an output of A and an input of B which may be a path including other devices or means.

Thus, while there has been described what are believed to be the preferred embodiments of the invention, those skilled in the art will recognize that other and further modifications may be made thereto without departing from the spirit of the invention, and it is intended to claim all such changes and modifications as fall within the scope of the invention. For example, any formulas given above are merely representative of procedures that may be used. Functionality may be added or deleted from the block diagrams and operations may be interchanged among functional blocks. Steps may be added or deleted to methods described within the scope of the present invention.

We claim:

1. A computer-readable storage medium encoded with instructions that when executed by one or more processors of a processing system cause carrying out a method of processing an ordered series of digital signals that each have an amplitude from a finite set of amplitudes consisting of a most likely-to-occur amplitude and at least one other amplitude, the at least one other amplitude including a next-to-most likely-to-occur amplitude to the most likely-to-occur amplitude, the processing to reduce the amount of data used to represent the digital signals and to form codewords such that on average, the digital signals or sequences of digital signals that have values that are relatively more likely-to-occur are represented by relatively short codewords and the digital signals or sequences of digital signals that have values that are relatively less likely-to-occur are represented by relatively long codewords, the method comprising:

for a particular contiguous region in the series:
(a) for each of a subset of a number of amplitude values, the number at least one, the amplitude values in the subset including the next-to-most likely-to-occur amplitude to the most likely-to-occur amplitude of the series, and, if the number is greater than one, also including at least one other amplitude value that includes at least one respective next-to-most likely-to-occur amplitude or amplitudes to the next-to-most likely-to-occur amplitude to the most likely-to-occur amplitude of the series, identifying events of a first kind that each includes an ending coefficient having the amplitude value either immediately preceded by a run of one or more consecutive coefficients having the most likely-to-occur amplitude, or not immediately preceded by any coefficient having the most likely-to-occur amplitude, each event of the first kind distinguished by its ending amplitude value, and by the greater or equal to zero run length of the run;
(b) for each of the subset of amplitude values, encoding the identified events of the first kind by respective codewords according to a variable length coding method corresponding to the ending amplitude value, the coding method to jointly encode the ending amplitude and the run length, including a run length of zero, and designed such that for at least some of the possible events of the first kind, relatively more likely-to-occur events of the first kind are encoded by a shorter codeword than relatively less likely-to-occur events of the first kind;
(c) identifying events of a second kind that include a single ending coefficient having an amplitude other than the amplitude values of the subset, either immediately preceded by a run of one or more consecutive coefficients having the most likely-to-occur amplitude, or not immediately preceded by any coefficient having the most likely-to-occur amplitude, each events of the second kind identified by its greater or equal to zero run length;
(d) encoding the identified events of the second kind by respective codewords according to a second variable length coding method designed such that for at least some of the possible events of the second kind, relatively more likely-to-occur events of the second kind are encoded by a shorter codeword than relatively less likely-to-occur events of the second kind; and
(e) encoding, according to a third coding method, the series of coefficients in the concatenation of the coefficients having amplitudes other than the amplitudes of the subset, such that relatively short codewords are formed to represent signal values or sequences of signal values that are relatively more likely-to-occur, and relatively long codewords are formed to represent signal values or sequences of signal values that are relatively less likely-to-occur.

2. A computer-readable storage medium as recited in claim 1, wherein for the amplitude values other than the amplitudes of the subset, such amplitude values forming a second subset including a most likely-to-occur second subset amplitude value, said step (e) includes:
(i) identifying events that include a run of coefficients having the most likely-to-occur second subset amplitude value ending in a single amplitude value other than the most likely-to-occur second subset amplitude value, including the case of there being no immediately preceding coefficients having the most likely-to-occur second subset amplitude value, each event distinguished by its ending amplitude value, and by the greater or equal to zero run length of the run; and
(ii) encoding the events identified in (i) by respective codewords according to a variable length coding method that jointly encodes the ending amplitude and the run length by a codeword such that for at least some of the possible events, relatively more likely-to-occur events are encoded by a shorter codeword than relatively less likely-to-occur events.

3. A computer-readable storage medium as recited in claim 2, wherein the series of digital signals is a series of quantized coefficients of a transformed block of image data, the transform such that the most likely-to-occur amplitude is 0, and the next most likely-to-occur amplitude is 1, and wherein the number of amplitude values is one such that said step (a) recognizes any events of the first kind that end in a coefficient of amplitude 1, and such that the events of the second kind have any ending coefficient that has a non-zero amplitude greater than 1.

4. A computer-readable storage medium as recited in claim 1, wherein said step (e) includes:

recursively repeating steps (a), (b), (c), and (d) to a new sequence, each recursion's sequence being the concatenation of the coefficients having amplitudes other than the amplitudes of the previous recursion's subset, the repeating being until there are no more amplitude values to encode.

5. A computer-readable storage medium as recited in claim 4, wherein the series of digital signals is a series of quantized coefficients of a transformed block of image data, the transform such that the most likely-to-occur amplitude is 0, and the next most likely-to-occur amplitude is 1, and wherein the number of amplitude values in the subset is one such that initially, said step (a) recognizes any events of the first kind that end in a coefficient of amplitude 1, and such that initially, the events of the second kind have any ending coefficient that has a non-zero amplitude greater than 1.

6. A computer-readable storage medium as recited in claim 1, wherein the series of digital signals is a series of quantized coefficients of a transformed block of image data, the transform such that the most likely-to-occur amplitude is 0, and the next most likely-to-occur amplitude is 1, and wherein the transformed block of image data includes a DC term, and wherein the DC term is separately encoded, such that the series of digital signals is a set of non-DC quantized coefficients of a transformed block of image data.

7. A computer-readable storage medium as recited in claim 1, wherein the series of digital signals is a series of quantized coefficients of a transformed block of image data, the transform such that the most likely-to-occur amplitude is 0, wherein the encoding of the events of the first kind includes separately encoding the signs of the of the non-zero amplitude coefficients in the events of the first kind, and wherein the encoding of the events of the second kind includes separately encoding the signs of the non-zero amplitude coefficients in the events of the second kind.

8. A computer-readable storage medium as recited in claim 1, wherein the series of digital signals is a series of quantized coefficients of a transformed block of image data, the transform such that the most likely-to-occur amplitude is 0, and wherein the method further comprises separately encoding the signs of the non-zero amplitude coefficients.

9. A computer-readable storage medium as recited in claim 1, wherein the series of digital signals is a series of quantized coefficients of a transformed block of image data, the transform such that the most likely-to-occur amplitude is 0, and wherein the first and second coding methods each uses a respective coding table that provides a respective coding codeword for each pair of the runlength of the immediately preceding run of none or more of preceding coefficients and the amplitude of the ending coefficient of amplitude or range of amplitudes.

10. A computer-readable storage medium as recited in claim 1, wherein the series of digital signals is a series of quantized coefficients of a transformed block of image data, the transform such that the most likely-to-occur amplitude is 0, and wherein the sequence of first and second coding methods each uses a respective coding table that provides a respective coding codeword for each pair of the runlength of the immediately preceding run of none or more of preceding coefficients and the amplitude of the ending coefficient of amplitude or range of amplitudes.

11. A computer-readable storage medium as recited in claim 1, wherein the series of digital signals is a series of quantized coefficients of a transformed block of image data, the transform such that the most likely-to-occur amplitude is 0, and wherein the method further comprises:
providing a breakpoint to define a first contiguous region along the ordering of the series followed by the particular continuous region wherein non-zero-valued coefficients are likely to be scattered.

12. A tangible computer-readable storage medium on which are encoded a set of codewords representing an ordered series of digital signals that each have an amplitude from a finite set of amplitudes consisting of a most likely-to-occur amplitude and at least one other amplitude, the at least one other amplitude including a next-to-most likely-to-occur amplitude to the most likely-to-occur amplitude, the processing to reduce the amount of data used to represent the digital signals and to form codewords such that on average, the digital signals or sequences of digital signals that have values that are relatively more likely-to-occur are represented by relatively short codewords and the digital signals or sequences of digital signals that have values that are relatively less likely-to-occur are represented by relatively long codewords, the set of codewords being generated by a method comprising:
for a particular contiguous region in the series:
(a) for each of a subset of a number of amplitude values, the number at least one, the amplitude values in the subset including the next-to-most likely-to-occur amplitude to the most likely-to-occur amplitude of the series, and, if the number is greater than one, also including at least one other amplitude value that includes at least one respective next-to-most likely-to-occur amplitude or amplitudes to the next-to-most likely-to-occur amplitude to the most likely-to-occur amplitude of the series, identifying events of a first kind that each includes an ending coefficient having the amplitude value either immediately preceded by a run of one or more consecutive coefficients having the most likely-to-occur amplitude, or not immediately preceded by any coefficient having the most likely-to-occur amplitude, each event of the first kind distinguished by its ending amplitude value, and by the greater or equal to zero run length of the run;
(b) for each of the subset of amplitude values, encoding the identified events of the first kind by respective codewords according to a variable length coding method corresponding to the ending amplitude value, the coding method to jointly encode the ending amplitude and the run length, including a run length of zero, and designed such that for at least some of the possible events of the first kind, relatively more likely-to-occur events of the first kind are encoded by a shorter codeword than relatively less likely-to-occur events of the first kind;
(c) identifying events of a second kind that include a single ending coefficient having an amplitude other than the amplitude values of the subset, either immediately preceded by a run of one or more consecutive coefficients having the most likely-to-occur amplitude, or not immediately preceded by any coefficient having the most likely-to-occur amplitude, each events of the second kind identified by its greater or equal to zero run length;
(d) encoding the identified events of the second kind by respective codewords according to a second variable length coding method designed such that for at least some of the possible events of the second kind, relatively more likely-to-occur events of the second kind are encoded by a shorter codeword than relatively less likely-to-occur events of the second kind; and
(e) encoding, according to a third coding method, the series of coefficients in the concatenation of the coefficients having amplitudes other than the amplitudes of the subset,
such that relatively short codewords are formed to represent signal values or sequences of signal values that are relatively more likely-to-occur, and relatively long codewords are formed to represent signal values or sequences of signal values that are relatively less likely-to-occur.

13. A computer readable storage medium as recited in claim 12, wherein for the amplitude values other than the amplitudes of the subset, such amplitude values forming a second subset including a most likely-to-occur second subset amplitude value, said step (e) includes:
(i) identifying events that include a run of coefficients having the most likely-to-occur second subset amplitude value ending in a single amplitude value other than the most likely-to-occur second subset amplitude value, including the case of there being no immediately preceding coefficients having the most likely-to-occur second subset amplitude value, each event distinguished by its ending amplitude value, and by the greater or equal to zero run length of the run; and (ii) encoding the events identified in (i) by respective codewords according to a variable length coding method that jointly encodes the ending amplitude and the run length by a codeword such that for at least some of the possible events, relatively more likely-to-occur events are encoded by a shorter codeword than relatively less likely-to-occur events.

14. A computer readable storage medium as recited in claim 13, wherein the series of digital signals is a series of quantized coefficients of a transformed block of image data, the transform such that the most likely-to-occur amplitude is 0, and the next most likely-to-occur amplitude is 1, and wherein the number of amplitude values is one such that said step (a) recognizes any events of the first kind that end in a coefficient of amplitude 1, and such that the events of the second kind have any ending coefficient that has a non-zero amplitude greater than 1.

15. A computer readable storage medium as recited in claim 12, wherein said step (e) includes:

recursively repeating steps (a), (b), (c), and (d) to a new sequence, each recursion's sequence being the concatenation of the coefficients having amplitudes other than the amplitudes of the previous recursion's subset, the repeating being until there are no more amplitude values to encode.

16. A computer readable storage medium as recited in claim 15, wherein the series of digital signals is a series of quantized coefficients of a transformed block of image data, the transform such that the most likely-to-occur amplitude is 0, and the next most likely-to-occur amplitude is 1, and wherein the number of amplitude values in the subset is one such that initially, said step (a) recognizes any events of the first kind that end in a coefficient of amplitude 1, and such that initially, the events of the second kind have any ending coefficient that has a non-zero amplitude greater than 1.

17. A computer-readable storage medium encoded with instructions that when executed by one or more processors of a processing system cause carrying out a method of decoding a bitstream obtained by a coding method, the decoding method comprising:

(i) recognizing codewords in the bitstream, the codewords obtained by the coding method, the coding method including, for a particular contiguous region in a series in an ordered series of quantized transform coefficients of a block of image data, the quantized transform coefficients each having an amplitude from a finite set of amplitudes consisting of a most likely-to-occur amplitude and at least one other amplitude, the at least one other amplitude including a next-to-most likely-to-occur amplitude to the most likely-to-occur amplitude:

(a) for each of a subset of a number of amplitude values, the number at least one, the amplitude values in the subset including the next-to-most likely-to-occur amplitude to the most likely-to-occur amplitude of the series, and, if the number is greater than one, also including at least one other amplitude value that includes at least one respective next-to-most likely-to-occur amplitude or amplitudes to the next-to-most likely-to-occur amplitude to the most likely-to-occur amplitude of the series, identifying events of a first kind that each includes an ending coefficient having the amplitude value either immediately preceded by a run of one or more consecutive coefficients having the most likely-to-occur amplitude, or not immediately preceded by any coefficient having the most likely-to-occur amplitude, each event of the first kind distinguished by its ending amplitude value, and by the greater or equal to zero run length of the run;

(b) for each of the subset of amplitude values, encoding the identified events of the first kind by respective codewords according to a variable length coding method corresponding to the ending amplitude value, the coding method to jointly encode the ending amplitude and the run length, including a run length of zero, and designed such that for at least some of the possible events of the first kind, relatively more likely-to-occur events of the first kind are encoded by a shorter codeword than relatively less likely-to-occur events of the first kind;

(c) identifying events of a second kind that include a single ending coefficient having an amplitude other than the amplitude values of the subset, either immediately preceded by a run of one or more consecutive coefficients having the most likely-to-occur amplitude, or not immediately preceded by any coefficient having the most likely-to-occur amplitude, each events of the second kind identified by its greater or equal to zero run length;

(d) encoding the identified events of the second kind by respective codewords according to a second variable length coding method designed such that for at least some of the possible events of the second kind, relatively more likely-to-occur events of the second kind are encoded by a shorter codeword than relatively less likely-to-occur events of the second kind; and (e) encoding, according to a third coding method, the series of coefficients in the concatenation of the coefficients having amplitudes other than the amplitudes of the subset, such that relatively short codewords are formed to represent signal values or sequences of signal values that are relatively more likely-to-occur, and relatively long codewords are formed to represent signal values or sequences of signal values that are relatively less likely-to-occur;

(ii) determining whether a codeword is an encoding of an event of the first kind, an encoding of an event of the second kind, or an encoding of a series of coefficients in a concatenation of coefficients having amplitudes other than the amplitudes of the subset of the coding method; and (iii) decoding the codewords to determine decoded events of the first kind or decoded events the second kind or a decoded series of coefficients in the concatenation of the coefficients having amplitudes other than the amplitudes of the subset.

18. A computer-readable storage medium as recited in claim 17, wherein in the coding method, for the amplitude values other than the amplitudes of the subset, such amplitude values forming a second subset including a most likely-to-occur second subset amplitude value, said step (e) of the coding method includes:
- (AA) identifying events that include a run of coefficients having the most likely-to-occur second subset amplitude value ending in a single amplitude value other than the most likely-to-occur second subset amplitude value, including the case of there being no immediately preceding coefficients having the most likely-to-occur second subset amplitude value, each event distinguished by its ending amplitude value, and by the greater or equal to zero run length of the run; and
- (BB) encoding the events identified in (AA) by respective codewords according to a variable length coding method that jointly encodes the ending amplitude and the run length by a codeword such that for at least some of the possible events, relatively more likely-to-occur events are encoded by a shorter codeword than relatively less likely-to-occur events.

19. A computer-readable storage medium as recited in claim 18,
wherein in the coding method, the series of digital signals is a series of quantized coefficients of a transformed block of image data, the transform such that the most likely-to-occur amplitude is 0, and the next most likely-to-occur amplitude is 1, and wherein in the coding method, the number of amplitude values is one such that said step (a) recognizes any events of the first kind that end in a coefficient of amplitude 1, and such that the events of the second kind have any ending coefficient that has a non-zero amplitude greater than 1.

20. A computer-readable storage medium as recited in claim 17, wherein said step (e) of the coding method includes:
recursively repeating steps (a), (b), (c), and (d) to a new sequence, each recursion's sequence being the concatenation of the coefficients having amplitudes other than the amplitudes of the previous recursion's subset, the repeating being until there are no more amplitude values to encode.

* * * * *

UNITED STATES PATENT AND TRADEMARK OFFICE
CERTIFICATE OF CORRECTION

PATENT NO. : 7,486,212 B2
APPLICATION NO. : 11/761307
DATED : February 3, 2009
INVENTOR(S) : Chen et al.

It is certified that error appears in the above-identified patent and that said Letters Patent is hereby corrected as shown below:

In column 3, line 16, kindly change "2DVL" to --2DVLC--

In column 6, line 6, kindly change "$N \geqq 1$" to --$N \geq 1$--

In column 8, line 49, kindly change "$N \geqq 1$" to --$N \geq 1$--

In column 9, line 61, kindly change "$n \geqq 0$" to --$n \geq 0$--

In column 10, line 33, kindly change "$n \geqq 0$" to --$n \geq 0$--

In column 11, line 66, kindly change "$n \geqq 0$" to --$n \geq 0$--

In column 12, line 1, kindly change "$n \geqq 0$" to --$n \geq 0$--

In column 12, line 3, kindly change "$n \geqq 0$" to --$n \geq 0$--

In column 12, line 37, kindly change "$n \geqq 0$" to --$n \geq 0$--

In column 12, line 56, kindly change "$N \geqq 2$" to --$N \geq 2$--

In column 13, line 62, kindly change "$\geqq 0$" to --$\geq 0$--

In column 13, line 67, kindly change "$n \geqq 0$" to --$n \geq 0$--

In column 14, line 5, kindly change "$n \geqq 0$" to --$n \geq 0$--

In column 14, line 10, kindly change "$n \geqq 0$" to --$n \geq 0$--

In column 14, line 13, kindly change "$K\ C_n$" to --${}^{K}C_n$--

In column 14, line 15, kindly change "$n \geqq 0$" to --$n \geq 0$--

UNITED STATES PATENT AND TRADEMARK OFFICE
CERTIFICATE OF CORRECTION

PATENT NO. : 7,486,212 B2
APPLICATION NO. : 11/761307
DATED : February 3, 2009
INVENTOR(S) : Chen et al.

It is certified that error appears in the above-identified patent and that said Letters Patent is hereby corrected as shown below:

In column 16, line 24, kindly change "$N \geqq 1$" to --$N \geq 1$--

In column 16, line 32, kindly change "$\geqq N$" to --$\geq N$--

In column 16, line 50, kindly change "$N \geqq 1$" to --$N \geq 1$--

In column 16, line 58, kindly change "$\geqq N$" to --$\geq N$--

In column 17, line 20, kindly change "$N \geqq 1$" to --$N \geq 1$--

In column 17, line 28, kindly change "$\geqq N$" to --$\geq N$--

Signed and Sealed this

Thirty-first Day of March, 2009

JOHN DOLL
*Acting Director of the United States Patent and Trademark Office*